United States Patent
Ryu et al.

(10) Patent No.: US 11,057,026 B2
(45) Date of Patent: Jul. 6, 2021

(54) SEMI-DYNAMIC FLIP-FLOP IMPLEMENTED AS MULTI-HEIGHT STANDARD CELL AND METHOD OF DESIGNING INTEGRATED CIRCUIT INCLUDING THE SAME

(71) Applicant: SAMSUNG ELECTRONICS CO., LTD., Suwon-si (KR)

(72) Inventors: Jongkyu Ryu, Seoul (KR); Minsu Kim, Hwaseong-si (KR); Ahreum Kim, Daegu (KR); Daeseong Lee, Busan (KR); Hyun Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/831,452

(22) Filed: Mar. 26, 2020

(65) Prior Publication Data
US 2021/0044283 A1 Feb. 11, 2021

(30) Foreign Application Priority Data
Aug. 7, 2019 (KR) ........................ 10-2019-0096365

(51) Int. Cl.
*H03K 3/356* (2006.01)
*H03K 3/012* (2006.01)
*H03K 19/20* (2006.01)

(52) U.S. Cl.
CPC ....... *H03K 3/356191* (2013.01); *H03K 3/012* (2013.01); *H03K 19/20* (2013.01)

(58) Field of Classification Search
CPC ... H03K 3/356191; H03K 3/012; H03K 19/20
USPC ........................................................ 716/126
See application file for complete search history.

(56) References Cited

U.S. PATENT DOCUMENTS

| | | | |
|---|---|---|---|
| 5,565,792 A | 10/1996 | Chiang et al. | |
| 6,445,065 B1 | 9/2002 | Gheewala et al. | |
| 6,448,829 B1* | 9/2002 | Saraf | H03K 3/012 |
| | | | 327/200 |
| 6,617,621 B1* | 9/2003 | Gheewala | H01L 27/11807 |
| | | | 257/203 |
| 8,648,392 B2 | 2/2014 | Nishimura et al. | |
| 9,160,317 B2 | 10/2015 | Singh et al. | |
| 9,257,439 B2 | 2/2016 | Liaw | |
| 9,418,189 B2 | 8/2016 | Lin et al. | |
| 9,641,161 B1 | 5/2017 | Liu et al. | |
| 9,722,611 B2 | 8/2017 | Hwang et al. | |

(Continued)

*Primary Examiner* — Suresh Memula
(74) *Attorney, Agent, or Firm* — F. Chau & Associates, LLC

(57) ABSTRACT

A semi-dynamic flip-flop includes a semiconductor substrate, first through fourth power rails, and at least one clock gate line. The first through fourth power rails are disposed on the semiconductor substrate, extend in a first direction, and are arranged sequentially in a second direction substantially perpendicular to the first direction. The at least one clock gate line is disposed on the semiconductor substrate, and extends in the second direction to pass through at least two regions among a first region between the first power rail and the second power rail, a second region between the second power rail and the third power rail, and a third region between the third power rail and the fourth power rail. The at least one clock gate line receives an input clock signal.

18 Claims, 34 Drawing Sheets

(56) References Cited

U.S. PATENT DOCUMENTS

| | | | |
|---|---|---|---|
| 2002/0040985 A1* | 4/2002 | Aldrich | H01L 27/11807 257/202 |
| 2002/0180485 A1* | 12/2002 | Sumita | H03K 19/0963 326/96 |
| 2005/0189976 A1* | 9/2005 | Muthalif | G06F 30/33 327/175 |
| 2011/0032016 A1* | 2/2011 | Maeno | H03K 3/356156 327/203 |
| 2017/0077908 A1* | 3/2017 | Berzins | H03K 3/356113 |
| 2017/0308638 A1* | 10/2017 | Gothi | H03K 3/35625 |
| 2018/0158811 A1* | 6/2018 | Subhash | H01L 27/0207 |
| 2018/0183414 A1* | 6/2018 | Guo | H01L 27/0207 |
| 2019/0304900 A1* | 10/2019 | Chen | H01L 23/528 |
| 2020/0044631 A1* | 2/2020 | Agarwal | H03K 3/012 |
| 2020/0136594 A1* | 4/2020 | Mittal | H03K 3/0372 |
| 2020/0243502 A1* | 7/2020 | Kim | H01L 27/0207 |

* cited by examiner

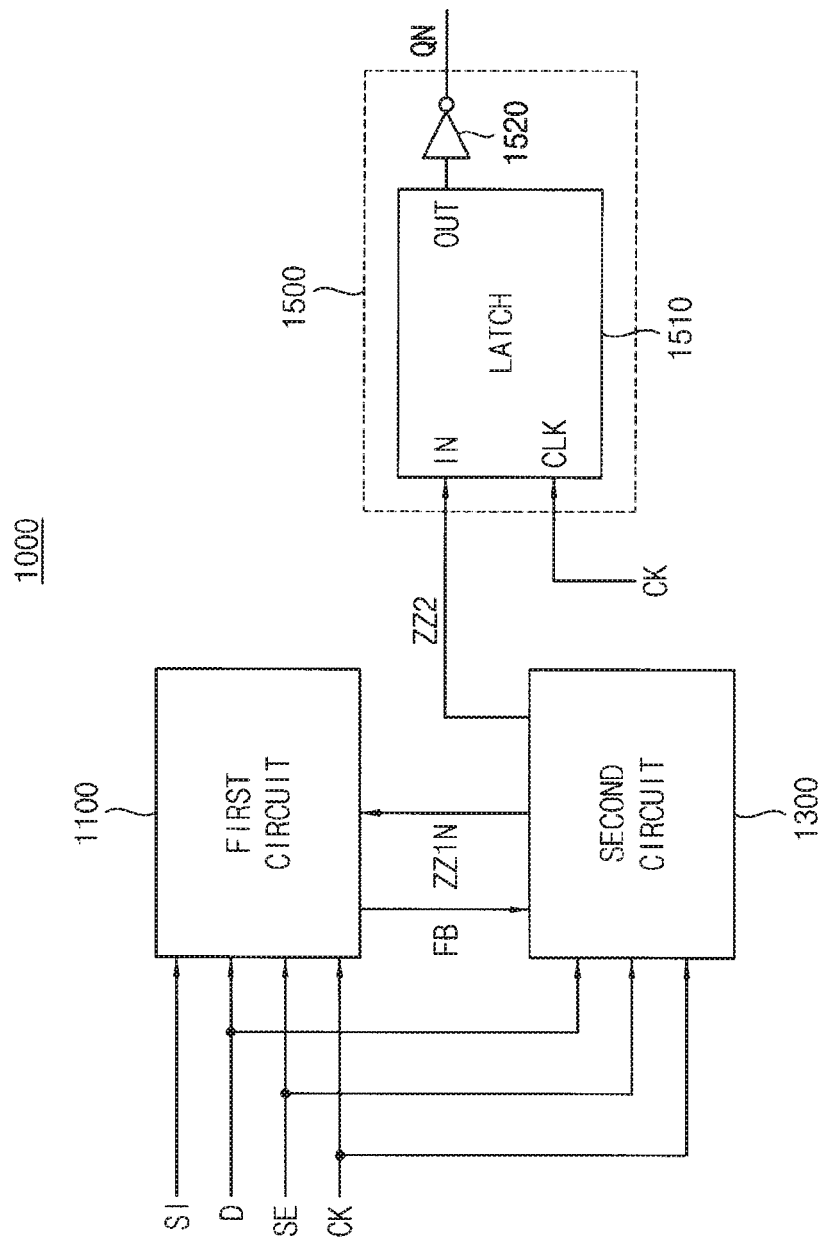

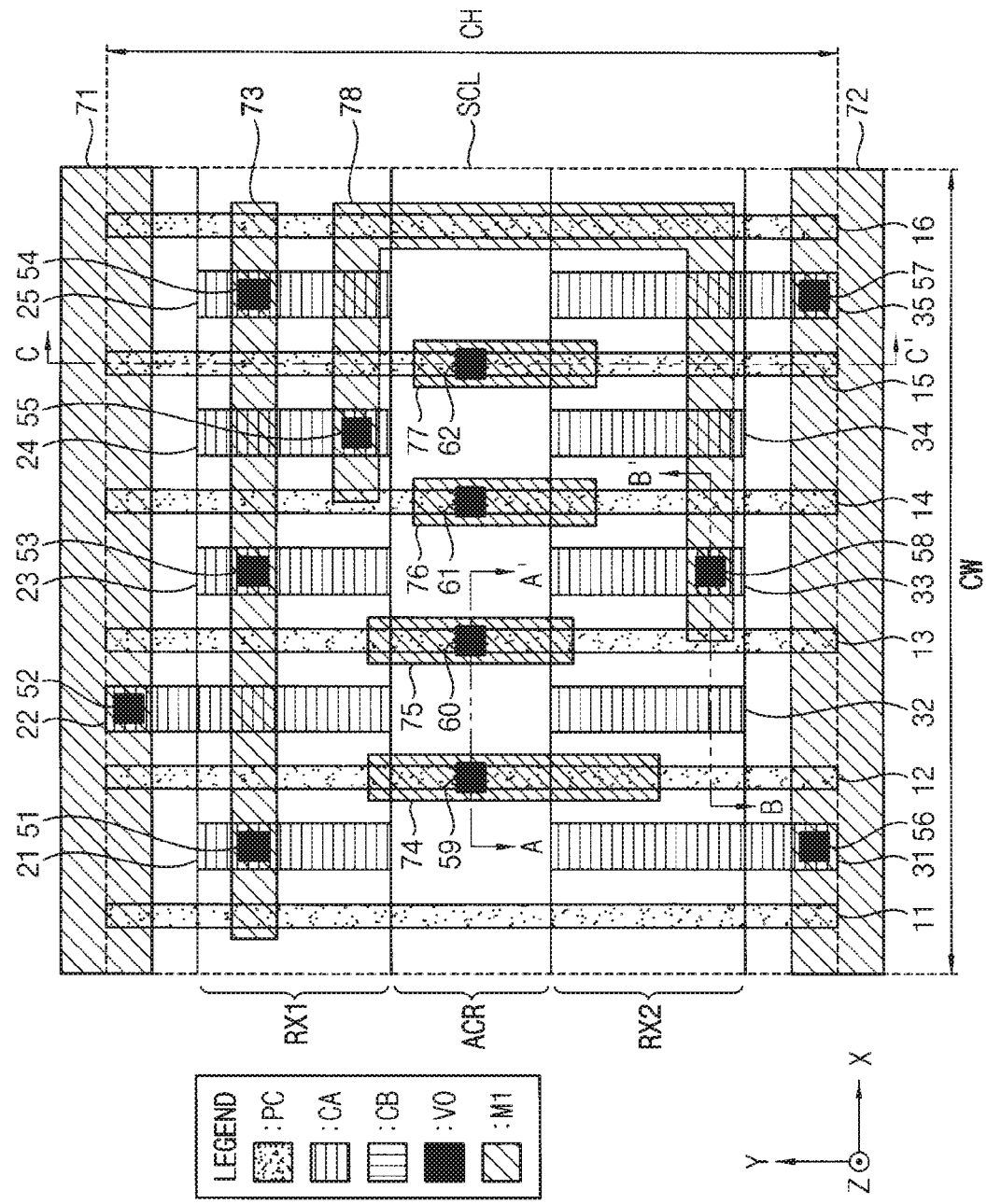

SEMI-DYNAMIC FLIP-FLOP IMPLEMENTED AS MULTI-HEIGHT STANDARD CELL AND METHOD OF DESIGNING INTEGRATED CIRCUIT INCLUDING THE SAME

CROSS-REFERENCE TO RELATED APPLICATIONS

This application claims priority under 35 U.S.C. § 119 to Korean Patent Application No. 10-2019-0096365, filed on Aug. 7, 2019 in the Korean Intellectual Property Office (KIPO), the disclosure of which is incorporated by reference herein in its entirety.

TECHNICAL FIELD

Exemplary embodiments relate generally to semiconductor integrated circuits, and more particularly, to a semi-dynamic flip-flop implemented as a multi-height standard cell, and a method of designing an integrated circuit including the semi-dynamic flip-flop.

DISCUSSION OF THE RELATED ART

Standard cells having corresponding functions may be used in the design of integrated circuits. The standard cells having predetermined architectures are stored in cell libraries. When designing integrated circuits, the standard cells are retrieved from the cell libraries and placed into desired locations on an integrated circuit layout. Routing is then performed to connect the standard cells with one another and/or with other cells. A standard cell has a predetermined (or set) architecture, e.g., a cell width, a cell height, a cell length, etc. Design efficiency of an integrated circuit may be determined according to configurations and layouts of standard cells.

SUMMARY

Exemplary embodiments provide a semi-dynamic flip-flop having an efficient signal routing structure and a method of designing the semi-dynamic flip-flop.

According to exemplary embodiments, a semi-dynamic flip-flop includes a semiconductor substrate, a first power rail, a second power rail, a third power rail, a fourth power rail, and at least one clock gate line. The first through fourth power rails are disposed on the semiconductor substrate, extend in a first direction, and are arranged sequentially in a second direction substantially perpendicular to the first direction. The at least one clock gate line is disposed on the semiconductor substrate, and extends in the second direction to pass through at least two regions among a first region between the first power rail and the second power rail, a second region between the second power rail and the third power rail, and a third region between the third power rail and the fourth power rail. The at least one clock gate line receives an input clock signal.

According to exemplary embodiments, a semi-dynamic flip-flop includes a semiconductor substrate, a plurality of power rails disposed on the semiconductor substrate, extending in a first direction, and arranged sequentially in a second direction substantially perpendicular to the first direction, and at least one clock gate line disposed on the semiconductor substrate, and extending in the second direction to pass through at least two regions among a plurality of regions between the plurality of power rails. The at least one clock gate line receives an input clock signal.

According to exemplary embodiments, a method of designing an integrated circuit includes receiving input data defining an integrated circuit, providing, in a standard cell library, at least one multi-height standard cell corresponding to a semi-dynamic flip-flop, performing placement and routing based on the input data and the standard cell library, and generating output data defining the integrated circuit based on a result of the placement and the routing. The multi-height standard cell includes a semiconductor substrate, a plurality of power rails disposed on the semiconductor substrate, extending in a first direction, and arranged sequentially in a second direction substantially perpendicular to the first direction, and at least one clock gate line disposed on the semiconductor substrate, and extending in the second direction to pass through at least two regions among a plurality of regions between the plurality of power rails. The at least one clock gate line receives an input clock signal.

The semi-dynamic flip-flop and the method of designing the semi-dynamic flip-flop according to exemplary embodiments may improve operation and reduce power consumption by implementing the semi-dynamic flip-flop as a multi-height standard cell having an efficient arrangement of nodes that significantly affect the power consumption. In addition, unnecessary metal wirings may be removed by arranging the same nodes or the correlated nodes and connecting the nodes using the gate lines, and thus, efficiency of design may be improved.

BRIEF DESCRIPTION OF THE DRAWINGS

The above and other features of the present inventive concept will become more apparent by describing in detail exemplary embodiments thereof with reference to the accompanying drawings, in which:

FIG. 3 is a block diagram illustrating a semi-dynamic flip-flop according to exemplary embodiments.

FIG. 9 is a diagram illustrating a layout of an example of a standard cell.

DETAILED DESCRIPTION OF THE EXEMPLARY EMBODIMENTS

Figure 1:
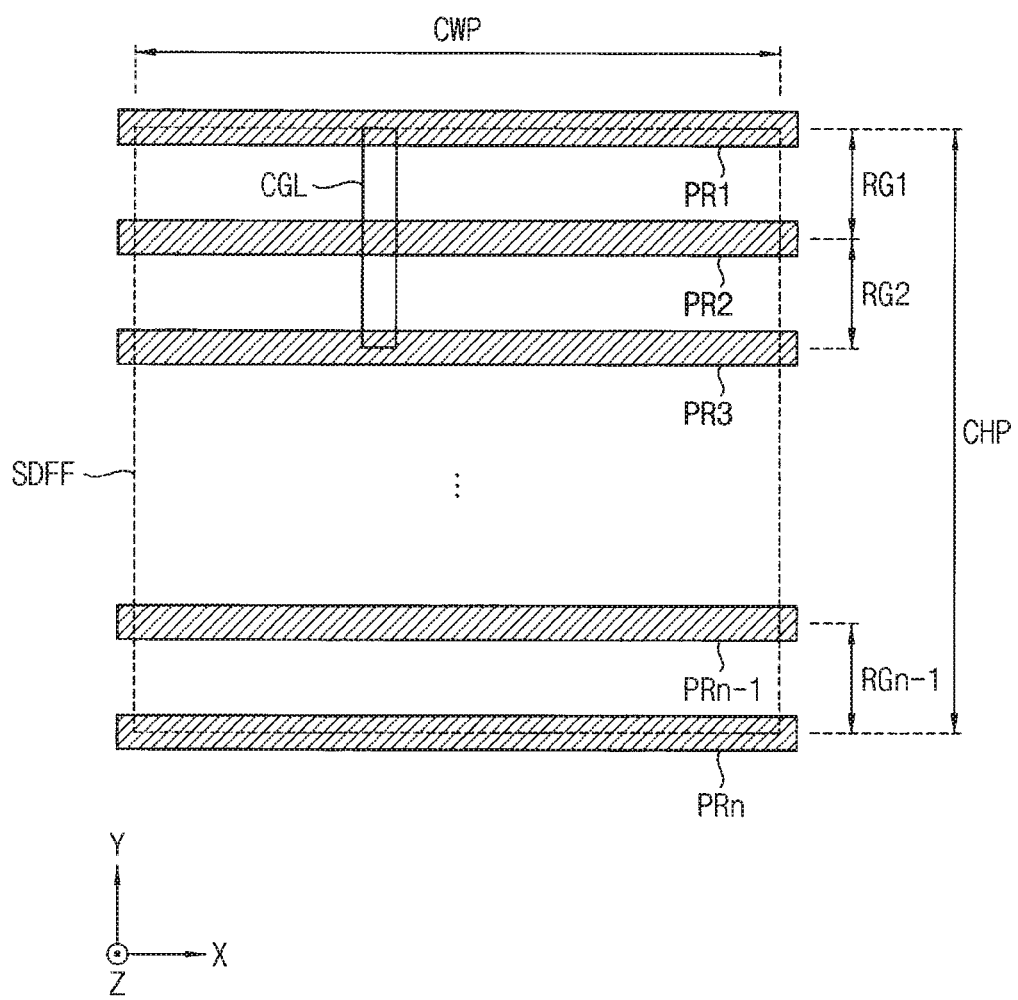
FIG. 1 is a diagram illustrating a layout of a semi-dynamic flip-flop according to exemplary embodiments.

Exemplary embodiments will be described more fully hereinafter with reference to the accompanying drawings. Like reference numerals may refer to like elements throughout the accompanying drawings.

Hereinafter, structures of an integrated circuit according to exemplary embodiments are described using a first direction X, a second direction Y, and a third direction Z in a three-dimensional space. The first direction X may be a row direction, the second direction Y may be a column direction, and the third direction Z may be a vertical direction. The first direction X, the second direction Y, and the third direction Z may intersect, e.g., may be substantially orthogonal or substantially perpendicular to one another.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

Further, when two directions are described as being substantially parallel or perpendicular to each other, it is to be understood that the two directions are exactly parallel or perpendicular to each other, or are approximately parallel or perpendicular to each other within a measurement error as would be understood by a person having ordinary skill in the art.

FIG. 1 is a diagram illustrating a layout of a semi-dynamic flip-flop according to exemplary embodiments.

Referring to FIG. 1, a semi-dynamic flip-flop SDFF may include a plurality of power rails PR1-PRn (n being a positive integer) and at least one clock gate line CGL.

The plurality of power rails PR1-PRn are formed above a semiconductor substrate, extend in a first direction and X, and are arranged sequentially in a second direction Y substantially perpendicular to the first direction X.

Herein, when an element such as, for example, the plurality of power rails PR1-PRn are described as extending in a certain direction such as, for example, the first direction X, the element may extend lengthwise in the certain direction.

The clock gate line CGL is formed above the semiconductor substrate and extends in the second direction Y to pass through at least two regions among a plurality of regions RG1-RGn−1 between the plurality of power rails PR1-PRn. The clock gate line GGL receives an input clock signal. FIG. 1 illustrates an example in which the one clock gate line CGL passes through the first region RG1 between the first power rail PR1 and the second power rail PR2, and the second region RG2 between the second power rail PR2 and the third power rail PR3. However, exemplary embodiments are not limited thereto. For example, according to exemplary embodiments, the clock gate line CGL may extend to pass through three or more of the plurality of regions RG1-RGn−1. In exemplary embodiments, the semi-dynamic flip-flop SDFF may include two or more clock gate lines CGL adjacent in the first direction X.

As a result, the semi-dynamic flip-flop SDFF may be formed in the plurality of regions RG1-RGn−1 between the plurality of power rails PR1-PRn. Each of the plurality of regions RG1-RGn−1 indicates a region between two adjacent power rails among the plurality of power rails PR1-PRn. The semi-dynamic flip-flop SDFF may be implemented as a standard cell having a cell height CHP and a cell width CWP. The standard cell corresponding to the semi-dynamic flip-flop SDFF according to exemplary embodiments has a cell height CHP that is (n−1) times a cell height CH (see FIG. 9) of normal standard cells, and may be referred to as a multi-height standard cell.

Figure 2:
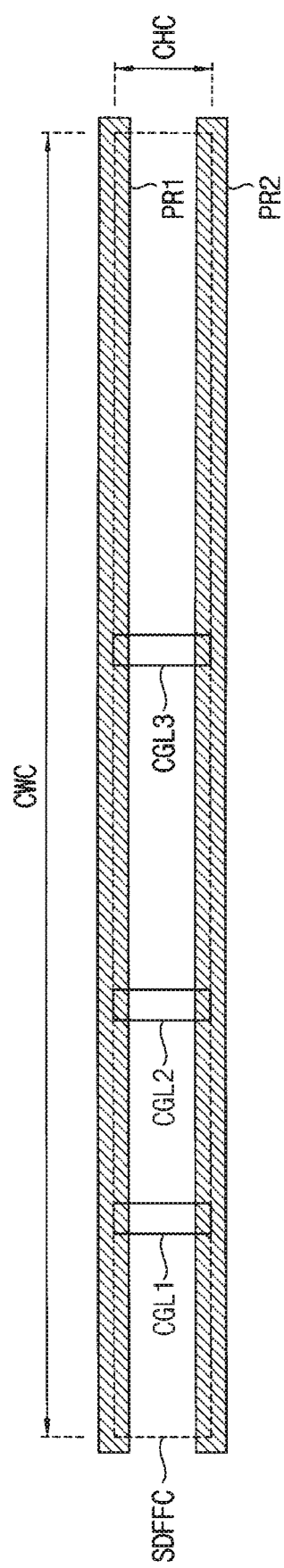
FIG. 2 is a diagram illustrating a layout of a semi-dynamic flip-flop according to a comparative example.

FIG. 2 is a diagram illustrating a layout of a semi-dynamic flip-flop according to a comparative example.

Referring to FIG. 2, a semi-dynamic flip-flop SDFFC in a comparative example is formed in one region between two adjacent power rails PR1 and PR2. The semi-dynamic flip-flop SDFFC may be implemented as a standard cell having a cell height CHC and a cell width CWC.

When the semi-dynamic flip-flop SDFF is formed in the one region, a plurality of clock gate lines CGL1, CGL2 and CGL3 are distributed in the one region due to design limitations. In such a layout, complex metal wirings may be required, and the loads of the metal lines may be increased.

As the scale of semiconductor manufacturing processes is decreased, the area of the standard cell is also decreased. However, the size of the metal wirings cannot be decreased at the same ratio as the cell area, which may cause an increase of power consumption by back end of line (BEOL). In light of this, exemplary embodiments are provided herein that reduce the loads, that is, the capacitance, of the metal wirings.

A semi-dynamic flip-flop is different from a master-slave flip-flop in that the semi-dynamic flip-flop has an asymmetric structure and includes many complex nodes. The semi-dynamic flip-flop may substantially use the upper metal track because the space for the metal wirings is not sufficient. In addition, if the cell height is decreased to reduce the cell area, the loads of main nodes may be increased, and an increase of the power consumption and a decrease of the operation speed may be caused.

A semi-dynamic flip-flop and a method of designing a semi-dynamic flip-flop according to exemplary embodiments may improve operation and reduce power consumption by implementing the semi-dynamic flip-flop as a multi-height standard cell having an efficient arrangement of nodes that significantly affect the power consumption. In addition, unnecessary metal wirings may be removed by arranging the same nodes or the correlated nodes and connecting the nodes using the gate lines, thus improving efficiency of design.

FIG. 3 is a block diagram illustrating a semi-dynamic flip-flop according to exemplary embodiments.

Referring to FIG. 3, a semi-dynamic flip-flop 1000 includes a first circuit 1100, a second circuit 1300 and an output circuit 1500.

The first circuit 1100 may generate a first feedback signal FB based on an input data signal D, an input clock signal CK, a scan enable signal SE, a scan input signal SI, and a second feedback signal ZZ1N. The second circuit 1300 may generate the second feedback signal ZZ1N and a latch input signal ZZ2 based on the input data signal D, the input clock signal CK, the scan enable signal SE, and the first feedback signal FB. The output circuit 1500 may generate an output signal QN corresponding to the input data signal D or the scan input signal SI based on the input clock signal CK and the latch input signal ZZ2. The output circuit 1500 may include a latch circuit 1510 and an output buffer 1520. Although FIG. 3 illustrates the output buffer 1520 as one inverter as an example, exemplary embodiments are not limited thereto.

The first circuit 1100 and the second circuit 1300 may control each other through the first feedback signal FB and the second feedback signal ZZ1N, in a similar way to a set-reset (SR) latch.

In the semi-dynamic flip-flop 1000 according to exemplary embodiments, even if the input data signal D transitions before a negative setup time elapses from a time point when the input clock signal CK transitions from a first logic level to a second logic level, the latch input signal ZZ2 may transition.

Hereinafter, exemplary embodiments are described mainly based on a case in which a semi-dynamic flip-flop samples the input data signal D at a rising edge of the input clock signal CK. In this case, the first logic level may be a logic low level and the second logic level may be a logic high level. However, the inventive concept is not limited thereto. For example, exemplary embodiments may also be applied to cases in which a semi-dynamic flip-flop samples the input data signal D at a falling edge of the input clock signal CK. In this case, the first logic level may be a logic high level and the second logic level may be a logic low level. Exemplary embodiments of the rising-edge sampling may be modified to exemplary embodiments of the falling-edge sampling through signal inversion, exchange of transistor type between an N-type and a P-type, etc.

Figure 4A:
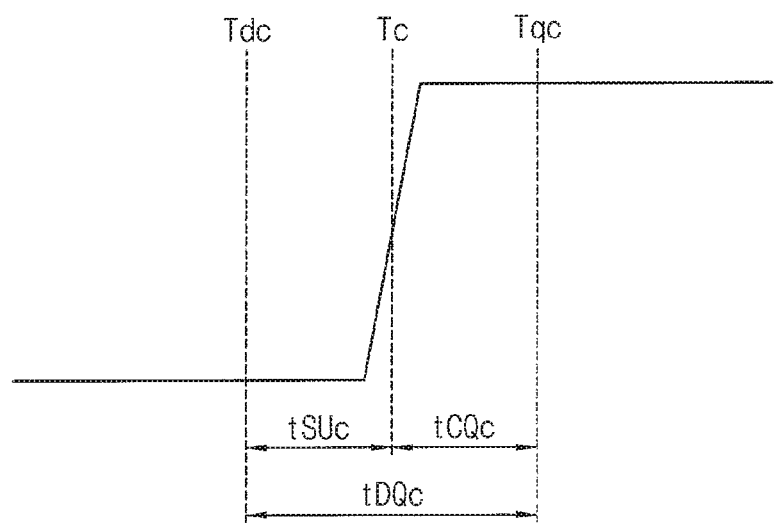
FIGS. 4A and 4B are diagrams for describing a negative setup time of a semi-dynamic flip-flop according to exemplary embodiments.
Figure 4B:
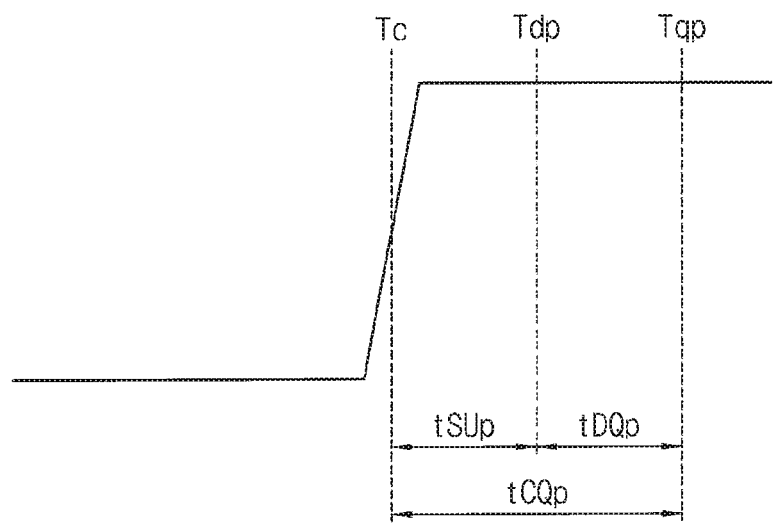

FIGS. 4A and 4B are diagrams for describing a negative setup time of a semi-dynamic flip-flop according to exemplary embodiments.

FIG. 4A illustrates a setup time tSUc, a clock-to-output delay time tCQc and an input-to-output delay time tDQc of a general semi-dynamic flip-flop. FIG. 4B illustrates a setup time tSUp, a clock-to-output delay time tCQp and an input-to-output delay time tDQp of a semi-dynamic flip-flop according to exemplary embodiments. In FIGS. 4A and 4B, Tc indicates a transitioning time point of an input clock signal, Tdc and Tdp indicate transitioning time points of an input signal, and Tqc and Tqp indicate transitioning time points of an output signal.

The speed of a flip-flop is generally determined by the input-to-output delay time tDQc. The input-to-output delay time tDQc is defined by a sum of a setup time tSUc and a clock-to-output delay time tCQc. The setup time tSUc is a time needed to stably provide data, that is, the data of the input signal, to the flip-flop. For example, the setup time tSUc indicates a time interval that the transition of the input signal has to be finished in advance prior to the sampling edge of the clock signal. The clock-to-output delay time tCQc indicates a delay time from a sampling of the clock signal to the issuance of the output data. Reducing the input-to-output delay time tDQc allows for the design of a high-speed flip-flop.

As illustrated in FIGS. 4A and 4B, the semi-dynamic flip-flop according to exemplary embodiments has a negative setup time tSUp. The negative setup time represents that the semi-dynamic flip-flop may reflect the transition of the input signal even after the transition of the sampling clock signal. The semi-dynamic flip-flop according to exemplary embodiments may have a reduced input-to-output delay time tDQ through the increased negative setup time tSUp, and thus, the operation speed of the semi-dynamic flip-flop and an integrated circuit including the semi-dynamic flip-flop may be increased.

Figure 5:
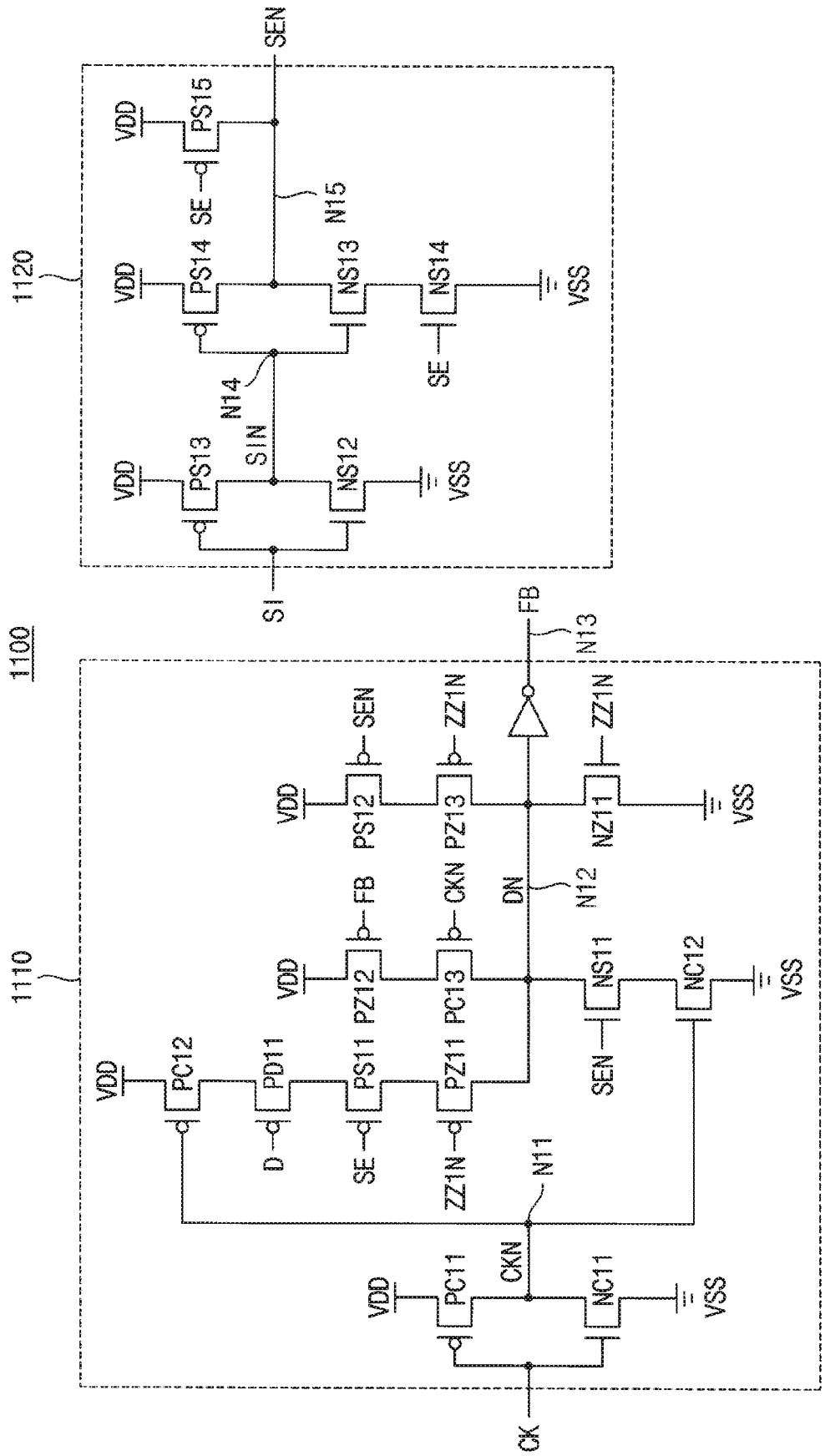
FIG. 5 is a circuit diagram illustrating an exemplary embodiment of a first circuit included in the semi-dynamic flip-flop of FIG. 3.

FIG. 5 is a circuit diagram illustrating an exemplary embodiment of the first circuit 1100 included in the semi-dynamic flip-flop of FIG. 3.

Referring to FIGS. 3 and 5, the first circuit 1100 may include a pulse generation circuit 1110 and a scan input circuit 1120. The first circuit 1100 may include clock transistors PC11 and NC11 receiving the input clock signal CK, inversion clock transistors PC12, PC13 and NC12 receiving an inverted clock signal CKN, data input transistor PD11 receiving the input data signal D, scan input transistors PS12, PS13, PS14, PS15, NS11, NS12 and NS13 receiving the scan input signal SI, an inverted scan input signal SIN or a delayed scan input signal SEN, scan enable transistors PS11, PS15 and NS14 receiving the scan enable signal SE, and feedback transistors PZ11, PZ12, PZ13 and NZ11 receiving the first feedback signal FB or the second feedback signal ZZ1N. The transistors may be disposed as illustrated in FIG. 5 between a power supply voltage VDD, a ground voltage VSS, a node N11 to which the inverted clock signal CKN is applied, a node N12 to which an intermediate data signal DN is applied, a node N13 to which the first feedback signal FB is applied, a node N14 to which the inverted scan input signal SIN is applied, and a node N15 to which the delayed scan input signal SEN is applied.

Figure 6:
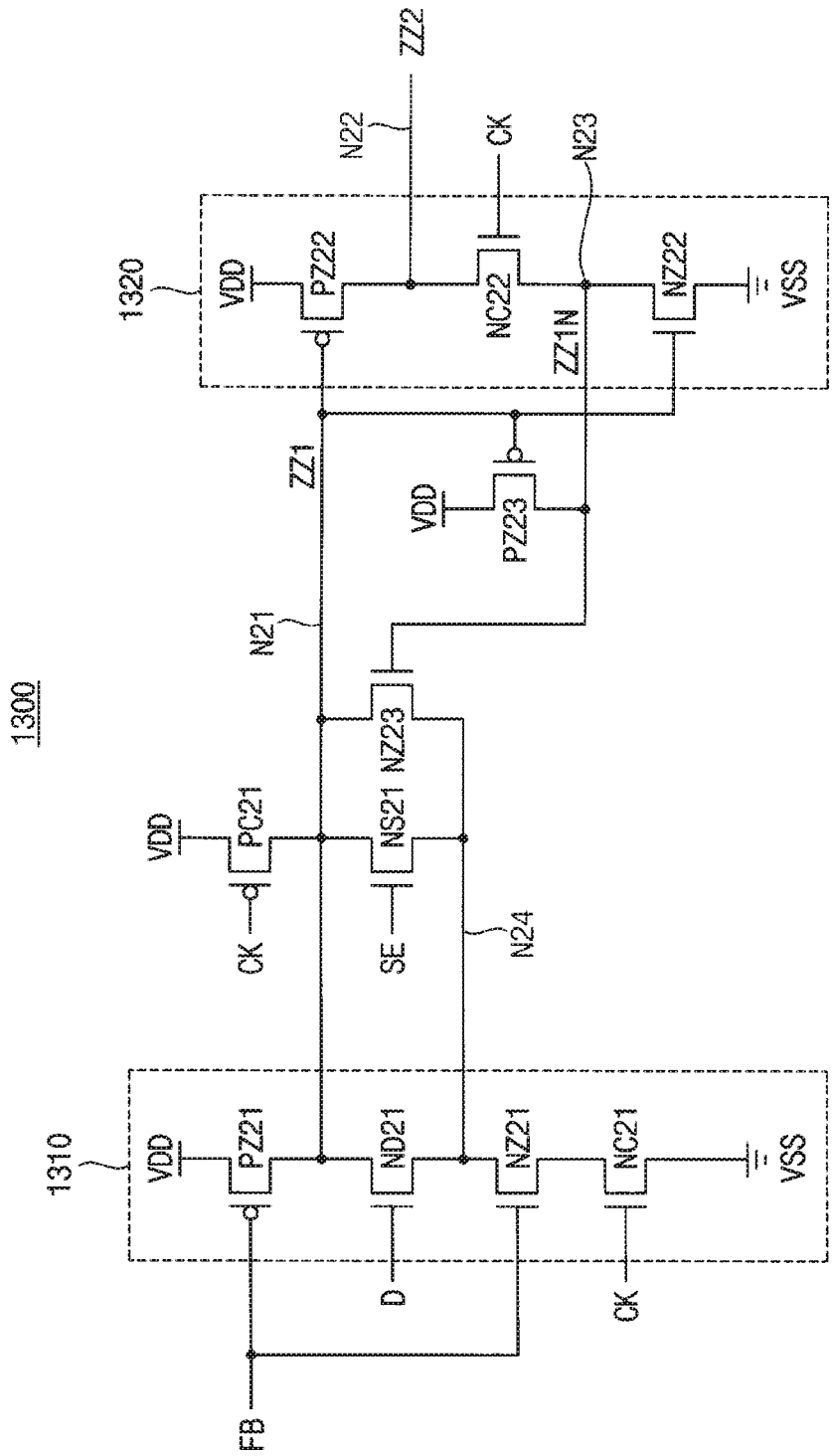
FIG. 6 is a circuit diagram illustrating an exemplary embodiment of a second circuit included in the semi-dynamic flip-flop of FIG. 3.

FIG. 6 is a circuit diagram illustrating an exemplary embodiment of the second circuit 1300 included in the semi-dynamic flip-flop of FIG. 3.

Referring to FIGS. 3 and 6, the second circuit 1300 may include a first stage circuit 1310 and a second stage circuit 1320. The second circuit 1300 may include feedback transistors PZ21, PZ22, PZ23, NZ21, NZ22 and NZ23 receiving the first feedback signal FB or the second feedback signal ZZ1N, clock transistors PC21, NC21 and NC22 receiving the input clock signal CK, data input transistor ND21 receiving the input data signal D, and scan enable transistor NS21 receiving the scan enable signal SE. The transistors may be disposed as illustrated in FIG. 6 between the power supply voltage VDD, the ground voltage VSS, a node N21 to which an intermediate feedback signal ZZ1 is applied, a node N22 to which the latch input signal ZZ2 is applied, a node N23 to which the second feedback signal ZZ1N is applied, and a node N24.

Figure 7:
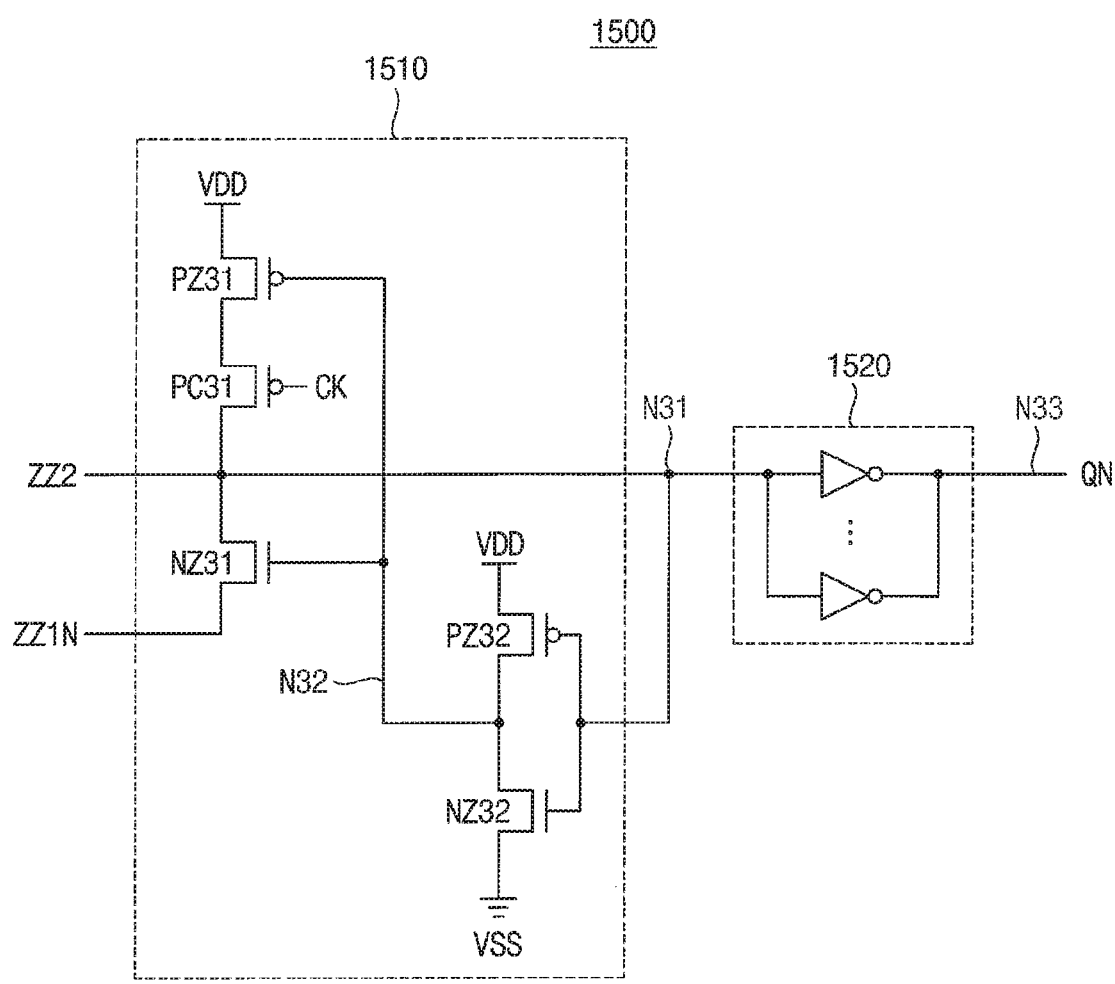
FIG. 7 is a circuit diagram illustrating an exemplary embodiment of an output circuit included in the semi-dynamic flip-flop of FIG. 3.

FIG. 7 is a circuit diagram illustrating an exemplary embodiment of the output circuit 1500 included in the semi-dynamic flip-flop of FIG. 3.

Referring to FIGS. 3 and 7, the output circuit 1500 may include a latch circuit 1510 and an output buffer 1520. The latch circuit 1510 may include feedback transistors PZ31, PZ32, NZ31 and NZ32 and a clock transistor PC31 disposed between the power supply voltage VDD, the ground voltage VSS and nodes N31 and N32, as illustrated in FIG. 7, to latch the latch input signal ZZ2. The output buffer 1520 may include a plurality of inverters connected in parallel between the node N31 to which the latch input signal ZZ2 is applied and an output node N33 from which an output signal QN is output.

Figure 8A:
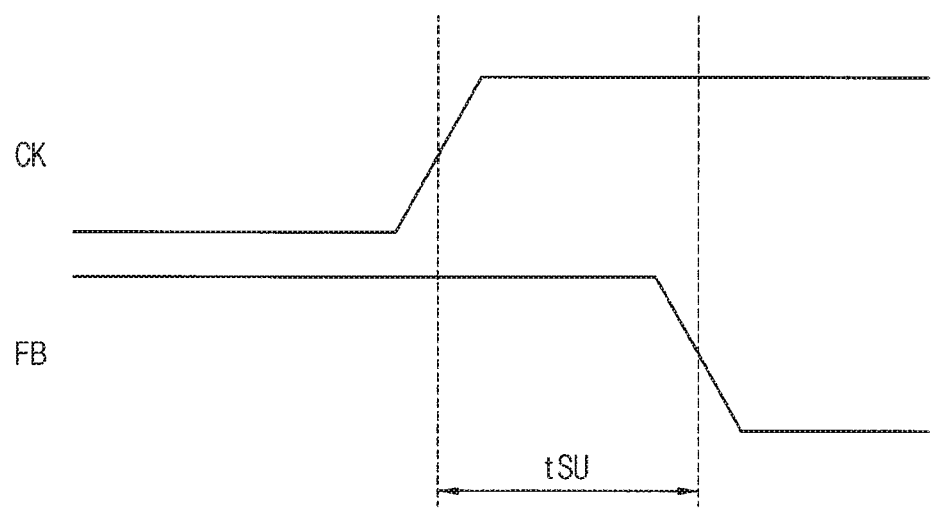
FIGS. 8A, 8B and 8C are timing diagrams illustrating a negative setup time of a semi-dynamic flip-flop according to exemplary embodiments.
Figure 8B:
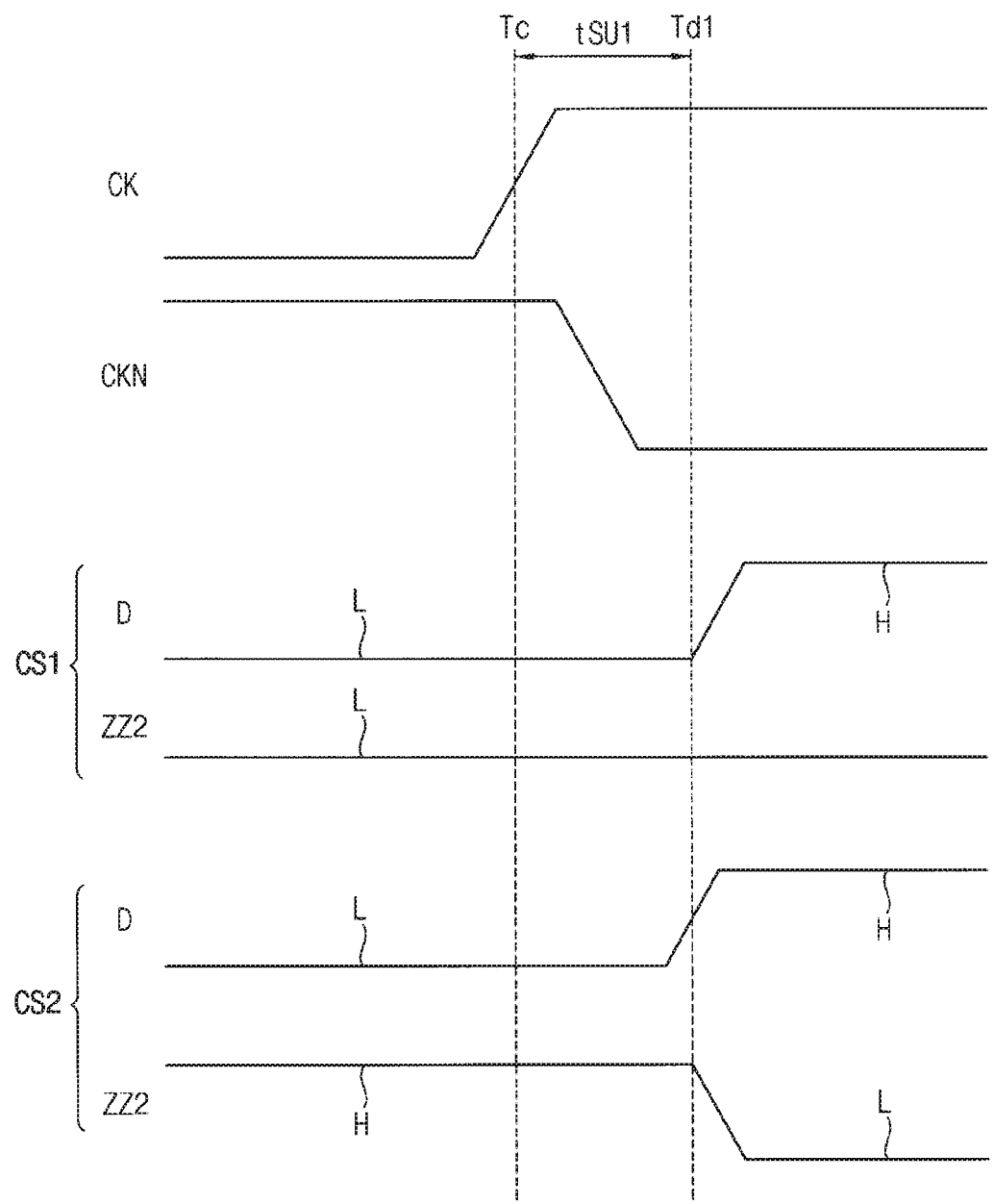
Figure 8C:
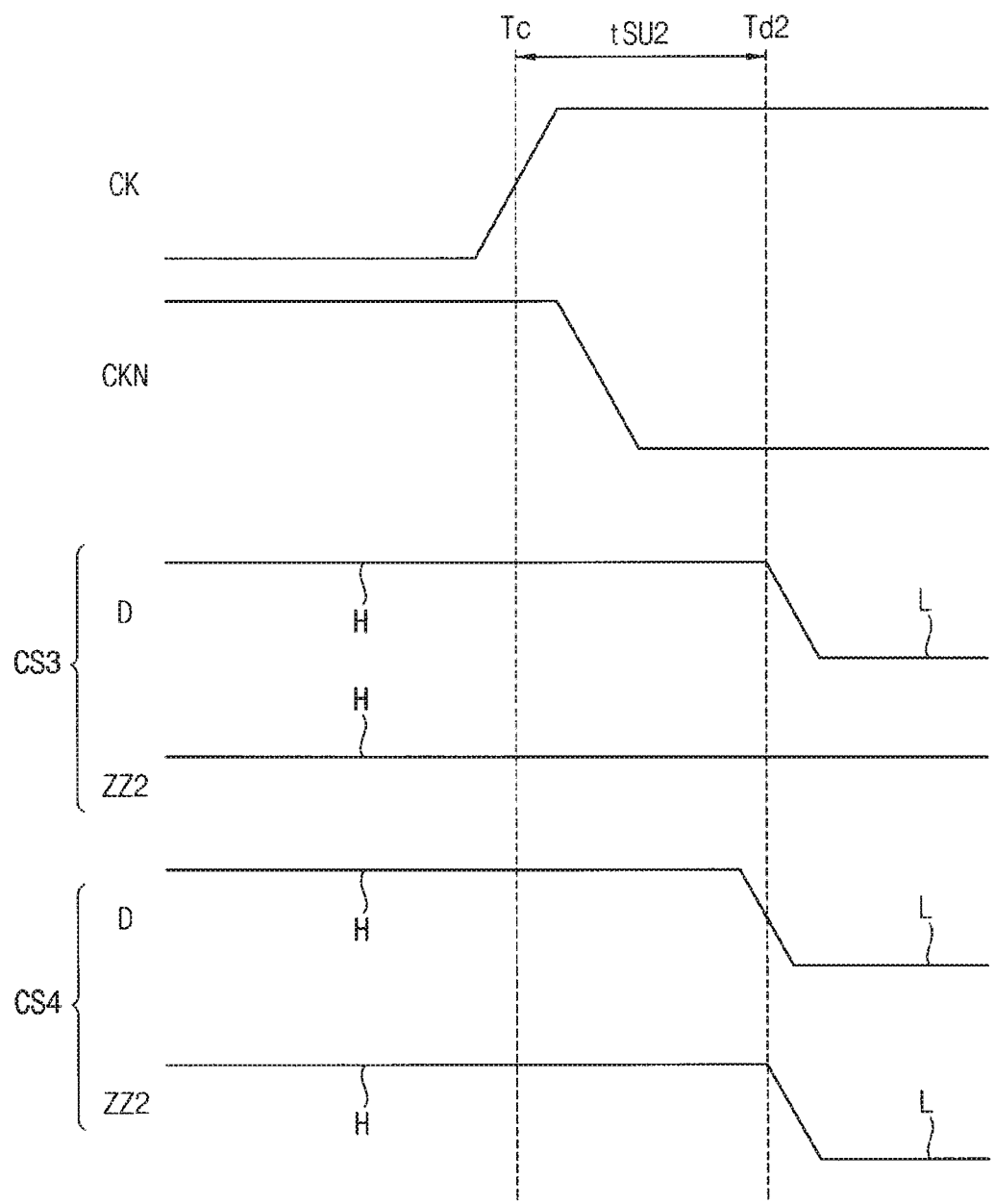

FIGS. 8A, 8B and 8C are timing diagrams illustrating a negative setup time of a semi-dynamic flip-flop according to exemplary embodiments.

Referring to FIG. 8A, a semi-dynamic flip-flop as described with reference to FIGS. 5, 6 and 7 may reflect a transition of the input data signal D between a rising edge of the input clock signal CK and a falling edge of the first feedback signal FB. For example, the above-described negative setup time tSU corresponds to a time interval between the rising edge of the input clock signal CK and the falling edge of the first feedback signal FB.

FIG. 8B illustrates a negative setup time tSU1 when the input data signal D transitions from the first logic level (the logic low level L) to the second logic level (the logic high level H), and FIG. 8C illustrates a negative setup time tSU2 when the input data signal D transitions from the logic high level H to the logic low level L. Tc indicates a transitioning time point of the input clock signal CK, Td1 indicates a transitioning time point of the first feedback signal FB, and Td2 indicates a transitioning time point of the second feedback signal ZZ1N.

When the input data signal D transitions from the logic low level L to the logic high level H, as is the case in FIG. 8B, the negative setup time corresponds to a first delay time tSU1 from the transitioning time point Tc of the input clock signal CK to the transitioning time point Td1 of the first feedback signal FB. In contrast, when the input data signal D transitions from the logic high level H to the logic low level L, as is the case in FIG. 8C, the negative setup time corresponds to a second delay time tSU2 from the transitioning time point Tc of the input clock signal CK to the transitioning time point Td2 of the second feedback signal ZZ1N.

Referring to FIG. 8B, a first case CS1 is that the input data signal D transitions upwardly (from the logic low level L to the logic high level H) after the transitioning time point Td1 of the first feedback signal FB, and a second case CS2 is that the input data signal D transitions upwardly (from the logic low level L to the logic high level H) before or at the transitioning time point Td1 of the first feedback signal FB. Referring to FIG. 8C, a third case CS3 is that the input data signal D transitions downwardly (from the logic high level H to the logic low level L) after the transitioning time point Td2 of the second feedback signal ZZ1N, and a fourth case CS4 is that the input data signal D transitions downwardly (from the logic high level H to the logic low level L) before or at the transitioning time point Td2 of the second feedback signal ZZ1N.

Referring to the second case CASE2 and the fourth case CASE4, if the input data signal D transitions before the negative setup time tSU1 or tSU2 elapses from the time point Tc when the input clock signal CK transitions from the logic low level L to the logic high level H, one of the first feedback signal FB and the second feedback signal ZZ1N may transition.

In contrast, referring to the first case CASE1 and the third case CASE3, if the input data signal D transitions after the negative setup time tSU1 or tSU2 elapses from the time point Tc, that is, the sampling time point, both of the first feedback signal FB and the second feedback signal ZZ1N do not transition.

As a result, the semi-dynamic flip-flop according to exemplary embodiments may have an increased negative setup time reflecting a transition of the input signal after a transition of the input clock signal, and thus, the operation speed of the semi-dynamic flip-flop and the integrated circuit including the semi-dynamic flip-flop may be increased.

To aid in understanding of layouts of the integrated circuit, a structure of a standard cell is described herein with reference to FIGS. 9, 10A, 10B and 10C.

Figure 10A:
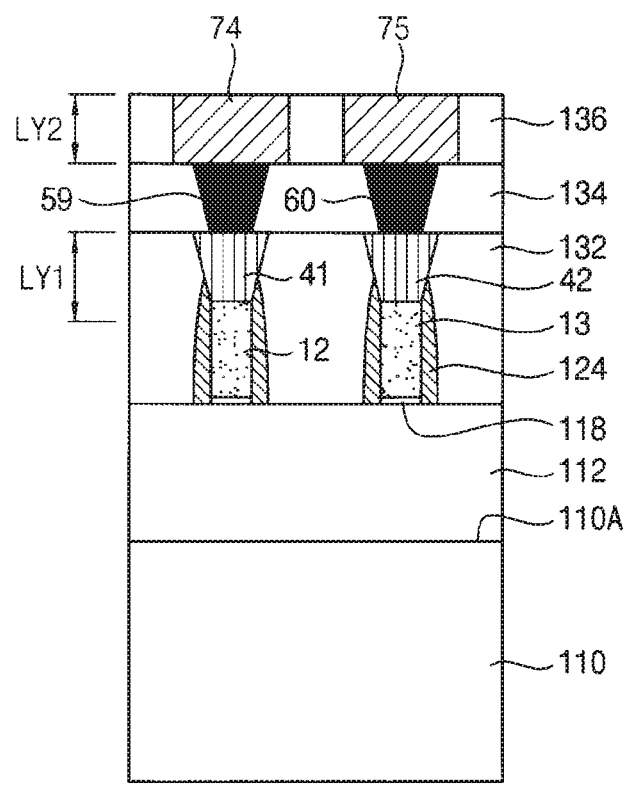
FIGS. 10A, 10B and 10C are cross-sectional views of a standard cell that may have the same layout as the standard cell of FIG. 9.
Figure 10B:
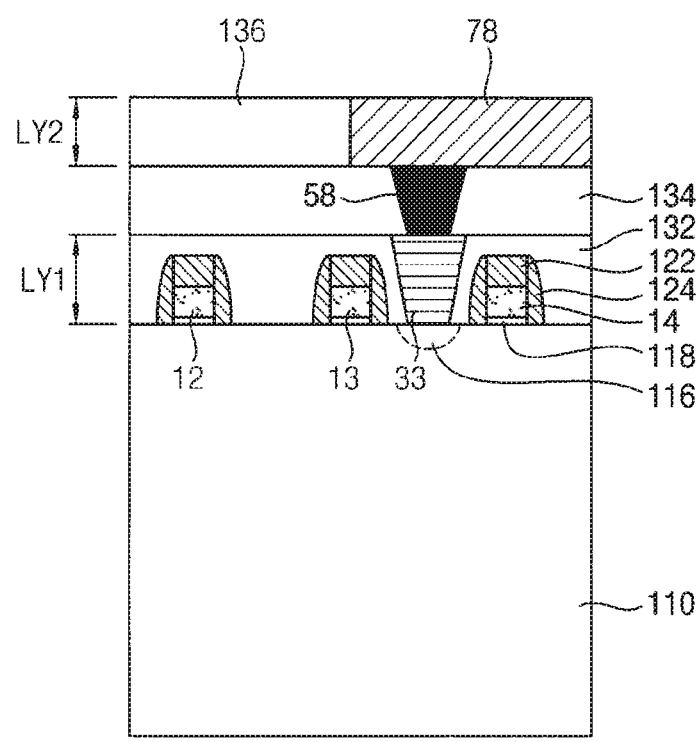
Figure 10C:
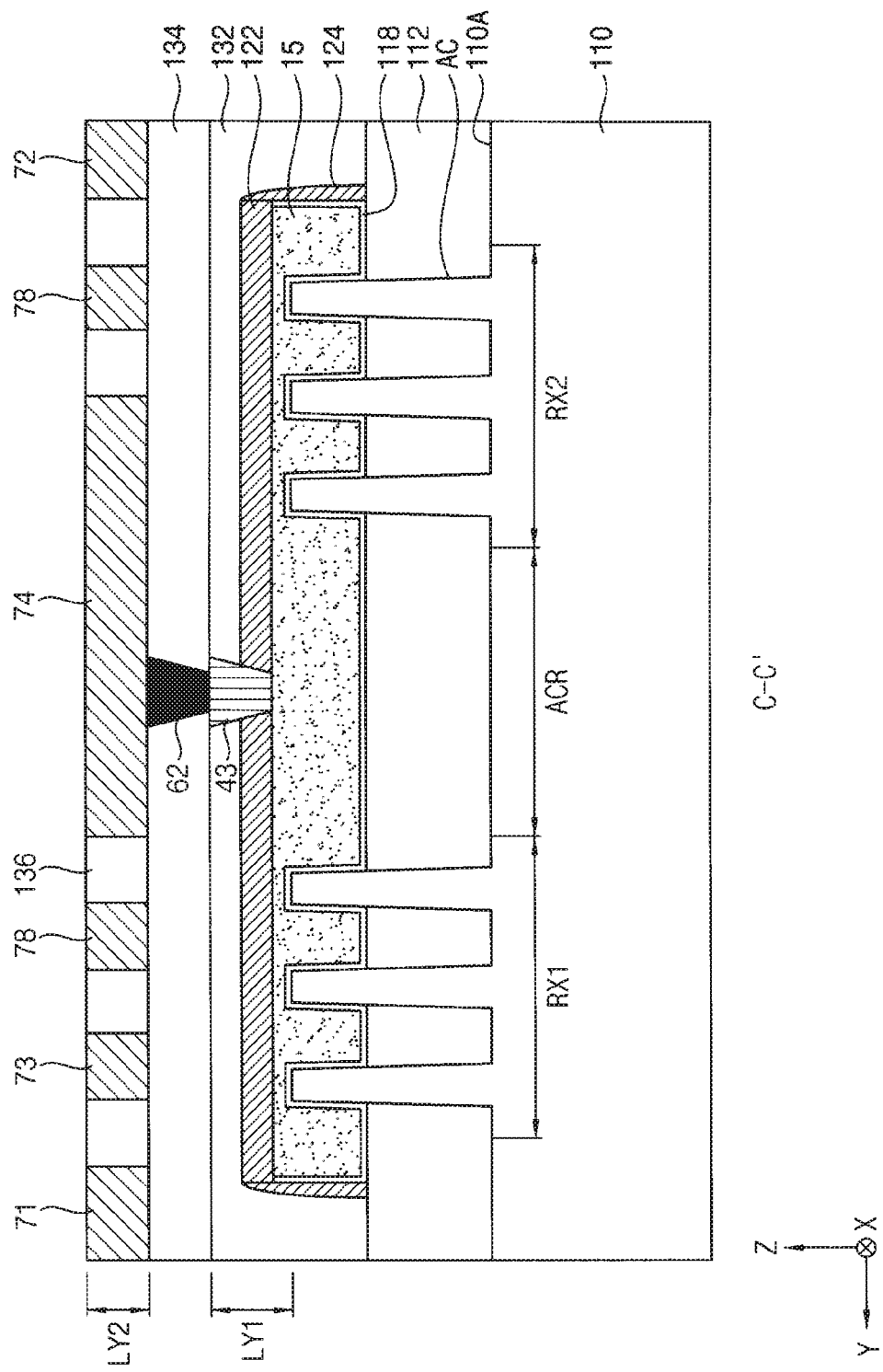

FIG. 9 is a diagram illustrating a layout of an example of a standard cell. FIGS. 10A, 10B and 10C are cross-sectional views of a standard cell that may have the same layout as the standard cell of FIG. 9.

FIGS. 10A, 10B and 10C illustrate a portion of a standard cell SCL that includes a fin field effect transistor (FinFET). FIG. 10A is a cross-sectional view of the standard cell SCL of FIG. 9 along line A-A' according to an exemplary embodiment. FIG. 10B is a cross-sectional view of the standard cell SCL of FIG. 9 along line B-B' according to an exemplary embodiment. FIG. 10C is a cross-sectional view of the standard cell SCL of FIG. 3 along line C-C' according to an exemplary embodiment.

Referring to FIGS. 9, 10A, 10B, and 10C, the standard cell SCL may be formed on a substrate 110 having an upper surface 110A that extends in a horizontal direction, e.g., the first direction X, and the second direction Y. The standard cell SCL may include a first device area RX1, a second device area RX2, and an active cut area ACR separating the first and second device areas RX1 and RX2 along the second direction Y. Each of the first and second device areas RX1 and RX2 may include a plurality of fin-type active areas AC protruding along the third direction Z from the substrate 110, as shown in FIG. 10C. In exemplary embodiments, the fin structure may be omitted in the case of bulk metal oxide semiconductor (MOS) processes. The active areas AC may extend substantially in parallel to one another in the first direction X. A device isolation layer 112 may be formed between the active areas AC on the substrate 110 along the second direction Y. The active areas AC protrude from the device isolation layer 112 along the third direction Z in the form of fins.

A plurality of gate insulation layers 118 and a plurality of gate lines PC 11-16 may be formed on the substrate 110. The gate lines PC 11-16 may extend in the direction Y crossing the active areas AC. The gate insulation layers 118 and the gate lines PC 11-16 may cover an upper surface and sidewalls of each of the active areas AC and an upper surface of the device isolation layer 112. A plurality of MOS transistors may be formed along the gate lines PC 11-16. The MOS transistors may have a three-dimensional structure in which channels are formed in the upper surface and the two sidewalls of the active areas AC.

The gate insulation layers 118 may be formed of, for example, a silicon oxide layer, a high-k dielectric layer, or a combination thereof. The gate insulation layers 118 may be formed, for example, by using an atomic layer deposition (ALD) method, a chemical vapor deposition (CVD) method, a physical vapor deposition (PVD) method, etc.

The gate lines PC 11-16 may extend on the gate insulation layers 118 across the active areas AC while covering the upper surface and the two sidewalls of each of the active areas AC. A mask 122 may be formed on each of the gate lines PC. Side walls of the insulation layer 118, the gate lines PC 11-16, and the mask 122 may be covered by a spacer 124. In exemplary embodiments, the gate mask 122 may be omitted, and the gate mask 122 may be removed at a portion of at least one of the gate lines PC 11-16 forming a conductive contact for an upper structure.

The gate lines PC 11-16 may have a structure in which a metal nitride layer, a metal layer, a conductive capping layer, and a gap-fill metal layer are sequentially stacked.

A plurality of conductive contacts CA and CB may be formed in a first layer LY1 on the active areas AC. The conductive contacts CA and CB may include a plurality of first contacts CA 21-25 and 31-35 connected to a source/drain area 116 of the active areas AC as shown in FIG. 10B, and a plurality of second contacts CB 41-43 connected to the gate lines PC 11-16 as shown in FIGS. 10A and 10C.

The conductive contacts CA and CB may be insulated from one another by a first interlayer insulation layer 132 that covers the active areas AC and the gate lines PC 11-16. The conductive contacts CA and CB may have an upper surface that is at substantially the same level as an upper surface of the first interlayer insulation layer 132. The first interlayer insulation layer 132 may be, for example, a silicon oxide layer.

A second interlayer insulation layer 134 and a plurality of lower via contacts V0 51-62 that pass through the second interlayer insulation layer 134 are formed on the first interlayer insulation layer 132. The second interlayer insulation layer 134 may be, for example, a silicon oxide layer.

A plurality of wirings M1 71-78 extending in the first direction X or in the second direction Y in a second layer LY2, which is higher than the first layer LY1 (e.g., further from the substrate 110 along the third direction Z), may be formed on the second interlayer insulation layer 134. Each of the wirings M1 71-78 may be connected to one of the conductive contacts CA and CB through one of the lower via contacts V0 51-62 formed between the first layer LY1 and the second layer LY2. Each of the lower via contacts V0 51-62 may be connected to one of the conductive contacts CA and CB, for example, by passing through the second interlayer insulation layer 134. The lower via contacts V0 51-62 may be insulated from one another by the second interlayer insulation layer 134. The wirings M1 71-78 may include an internal connection wiring that electrically connects a plurality of areas in the standard cell SCL. For example, the internal connection wiring 78 may electrically connect the active area AC in the first device area RX1 and the active area AC in the second device area RX2 through the lower via contacts 55 and 58 and the first contacts CA 24 and 33.

The wirings M1 71 and 72 may correspond to the first power rail PR1 and the second power rail PR2, respectively. The first power rail 71 may be connected to the active area AC in the first device area RX1. The second power rail 72 may be connected to the active area AC in the second device area RX2. One of the first and second power rails 71 and 72 may be a wiring for supplying a power supply voltage (e.g., the first power supply voltage VDD) and the other of the first and second power rails 71 and 72 may be a wiring for supplying a ground voltage (e.g., the second power supply voltage VSS). The first power rail 71 and the second power rail 72 may extend in the first direction X substantially parallel to each other in the second layer LY2. In exemplary embodiments, the power rails 71 and 72 may be formed at substantially the same time with the other wirings M1 73-78. The wirings M1 71-78 may pass through a third interlayer insulation layer 136. The third interlayer insulation layer 136 may insulate the wirings M1 71-78 from one another.

A cell height CH of the standard cell SCL may be defined by the distance along the second direction Y between the first power rail 71 and the second power rail 72. A cell width CW of the standard cell SCL may be defined along the first direction X that is substantially parallel to the power rails 71 and 72.

The integrated circuit according to exemplary embodiments may correspond to a combination of various standard cells. Hereinafter, the same reference marks or numerals may be used to indicate a signal and a node of the signal. For example, "CK" may be used to indicate a clock signal or a node to which the clock signal is applied.

Figure 11:
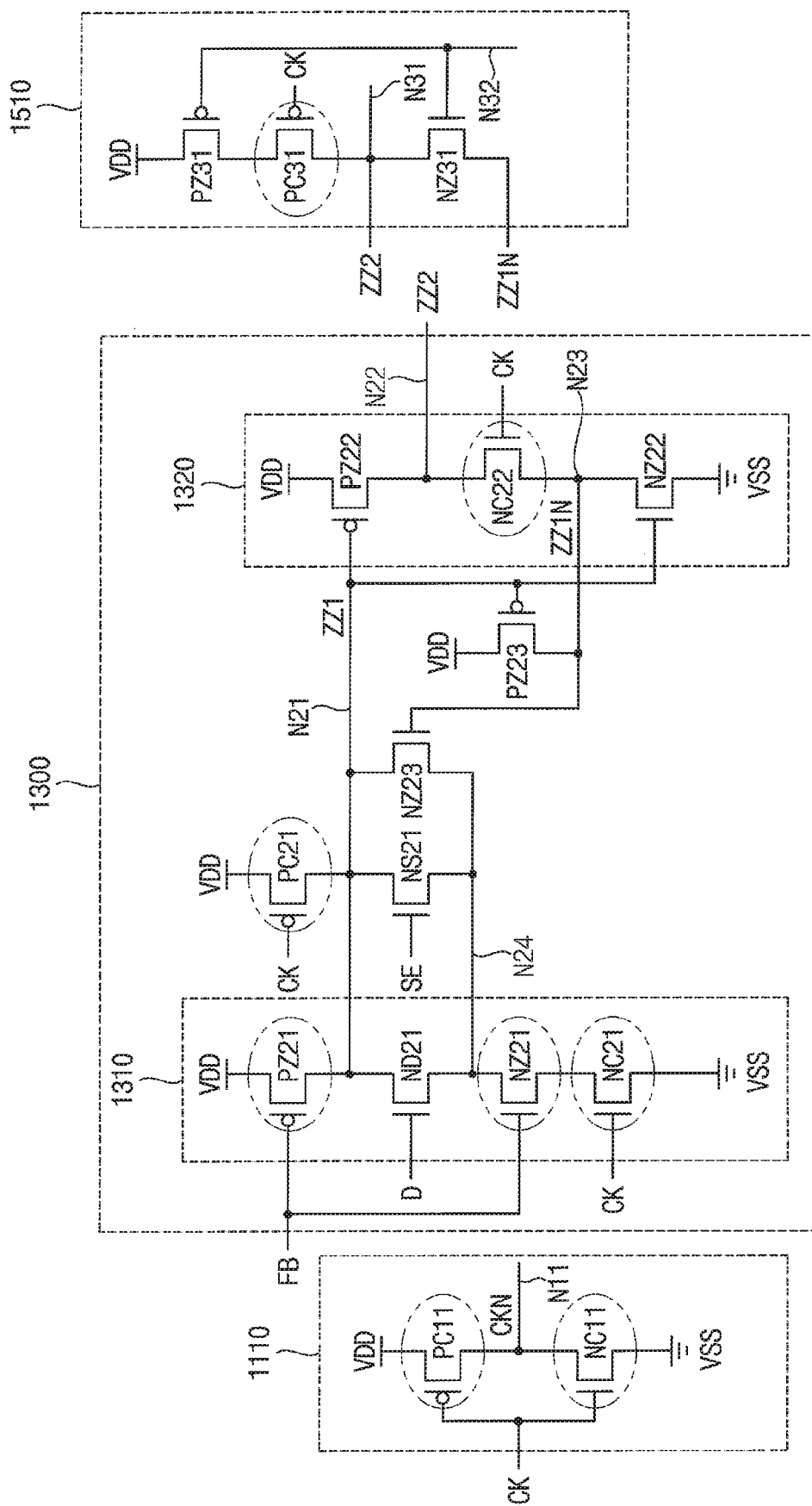
FIG. 11 is a diagram illustrating an example of clock transistors and feedback transistors included in a semi-dynamic flip-flop according to exemplary embodiments.
Figure 12A:
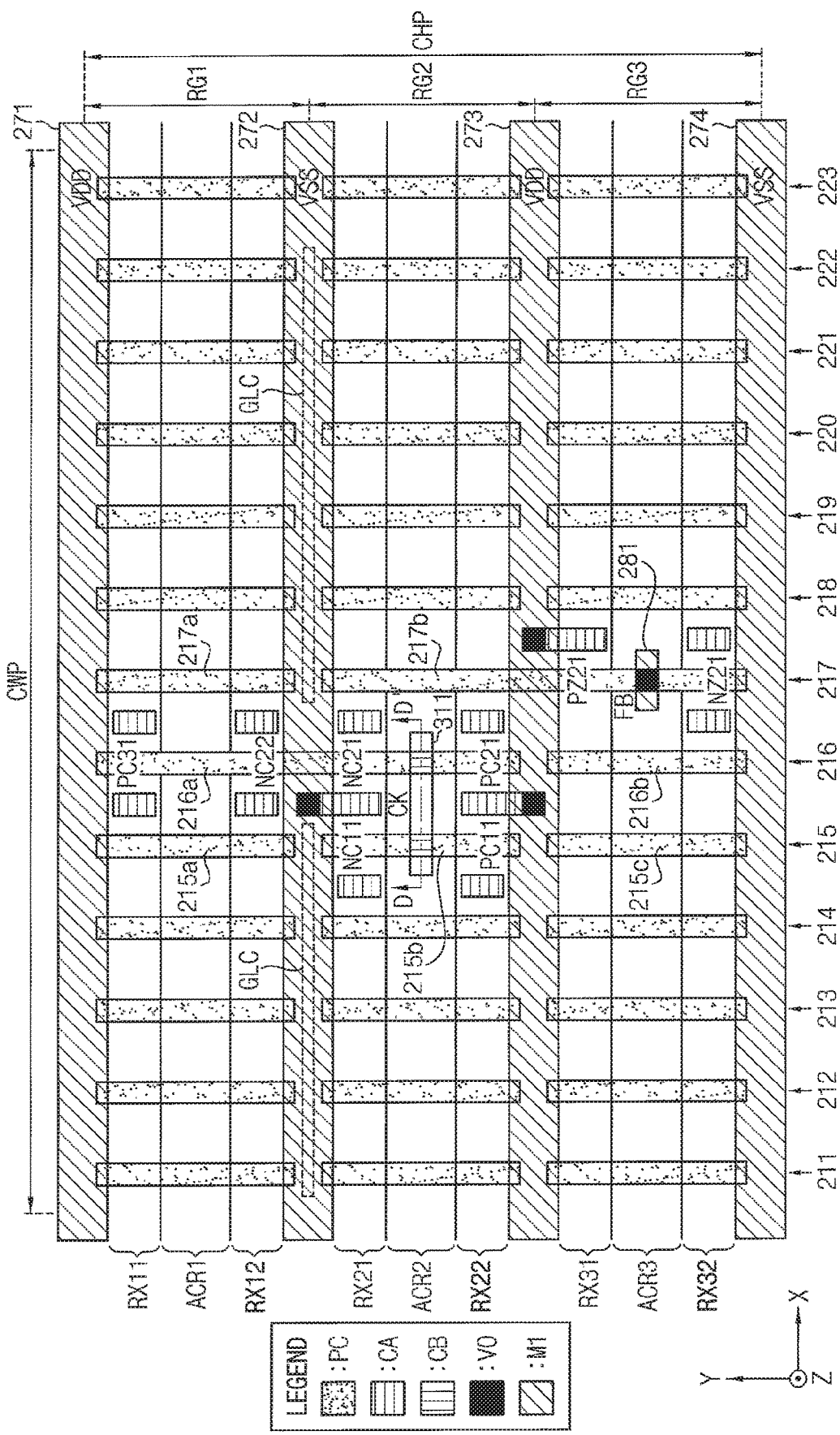
FIGS. 12A and 12B are diagrams illustrating an exemplary embodiment of a layout of arranging the clock transistors and the feedback transistors in FIG. 11.
Figure 12B:
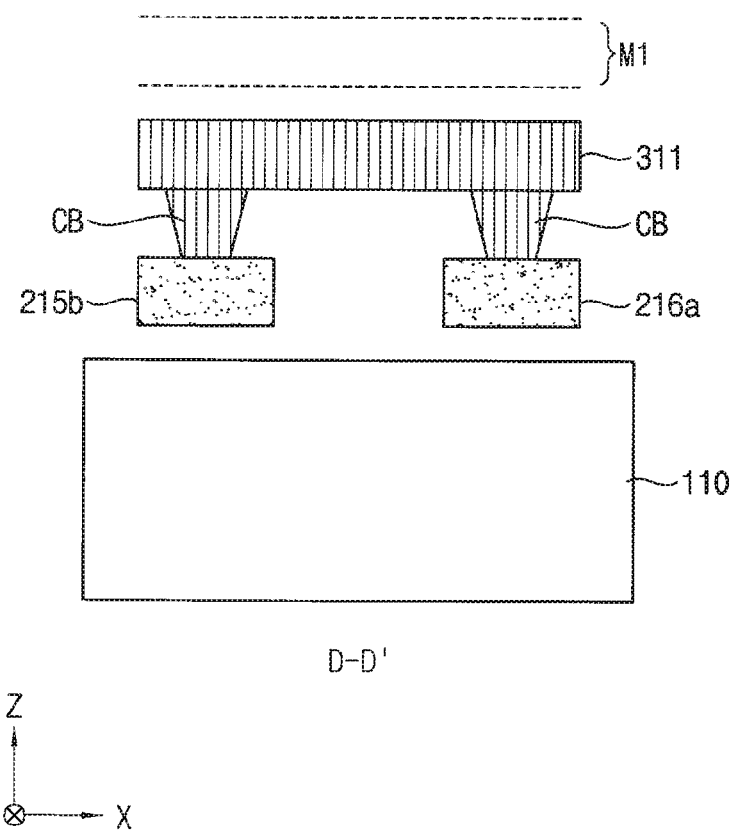

FIG. 11 is a diagram illustrating an example of clock transistors and feedback transistors included in a semi-dynamic flip-flop according to exemplary embodiments. FIGS. 12A and 12B are diagrams illustrating an exemplary embodiment of a layout of arranging the clock transistors and the feedback transistors in FIG. 11. FIG. 12B is a cross-sectional view of FIG. 11A along line D-D' according to an exemplary embodiment.

FIG. 11 illustrates a portion of the transistors of FIGS. 5, 6 and 7. FIG. 12A illustrates an exemplary embodiment of a layout of the clock transistors PC11, PC21, PC31, NC11, NC21, NC22 and the feedback transistors PZ21, NZ21, which are indicated by the dotted circles in FIG. 11.

The first region RG1 may include a first device area RX11, a second device area RX12 and a first active cut area ACR1. The second region RG2 may include a third device area RX21, a fourth device area RX22 and a second active cut area ACR2. The third region RG3 may include a fifth device area RX31, a sixth device area RX32 and a third active cut area ACR3. The region corresponding to the second power rail 272 between the first region RG1 and the second region RG2, and the region corresponding to the third power rail 273 between the second region RG2 and the third region RG3, may be referred to as a boundary region.

Referring to FIGS. 11, 12A and 12B, a multi-height standard cell corresponding to a semi-dynamic flip-flop may be formed using a semiconductor substrate 110, and include a first power rail 271, a second power rail 272, a third power rail 273, a fourth power rail 274, and a plurality of gate lines 211-223.

In FIG. 12A, the nodes of the same reference marks may be electrically connected to one another through upper wirings. The conductive contacts CA and CB and the wirings in the first metal layer M1 may be connected through lower via contacts V0, and the wirings in the first metal layer M1 and the wirings in a second metal layer may be connected through upper via contacts. The first metal layer M1 may be the lowest metal layer, or at least one metal layer may be disposed under the first metal layer M1. The power rails 271, 272, 273 and 274 and the metal wiring 281 may be formed in the first metal layer M1 as illustrated in FIG. 12A. However, exemplary embodiments are not limited thereto.

At least one of the gate lines may be cut or separated by a gate cut region GLC so that a gate line may include a plurality of gate segments. For example, the gate line 215 includes three gate segments 215a, 215b and 212c, the gate line 216 includes two gate segments 216a and 216b, and the gate line 217 includes two gate segments 217a and 217b.

The gate segment 216a corresponds to a first clock gate line, the gate segment 215b corresponds to a second clock gate line, and the gate segment 217b corresponds to a feedback gate line.

The first clock gate line 216a extends in the second direction Y to pass through the first region RG1 and the second region RG2 and receives the input clock signal CK. The second clock gate line 215b extends in the second direction Y to pass through the second region RG2 and receives the input clock signal CK. The second clock gate line 215b is adjacent to the first clock gate line 216a in the first direction X. The first clock gate line 216a is not cut by the gate cut region GLC in the first region RG1, the second region RG2 and the boundary region between the first region RG1 and the second region RG2.

The first clock gate line 216a forms gate electrodes of the clock transistors PC31 and NC22 formed in the first region RG1 and included in the output circuit 1500, and gate electrodes of the clock transistors NC21 and PC21 formed in the second region RG2 and included in the second circuit 1300. The second clock gate line 215b forms gate electrodes of the clock transistors NC11 and PC11 formed in the second region RG2 and included in the first circuit 1100.

Referring to FIGS. 12A and 12B, the first clock gate line 216a and the second clock gate line 215b may be electrically connected to each other through a gate connection via 311. The gate connection via 311 may be formed in the second region RG2 under the lowest metal layer M1 and extends in the first direction X to electrically connect the first clock gate line 216a and the second clock gate line 215b. The gate connection via 311 may be formed with the same material as the conductive contacts CB.

The feedback gate line 217b extends in the second direction Y to pass through the second region RG2 and the third region RG3. The feedback gate line 217b is adjacent to the first clock gate line 216a in the first direction X such that the first clock gate line 216a is disposed between the second clock gate 215b line and the feedback gate line 217b. The feedback gate line 217b receives the first feedback signal FB applied through the metal wiring 281. The feedback gate line 217b forms gate electrodes of the feedback transistors PZ21 and NZ21 formed in the third region RG3 and included in the output circuit 1500.

Figure 13A:
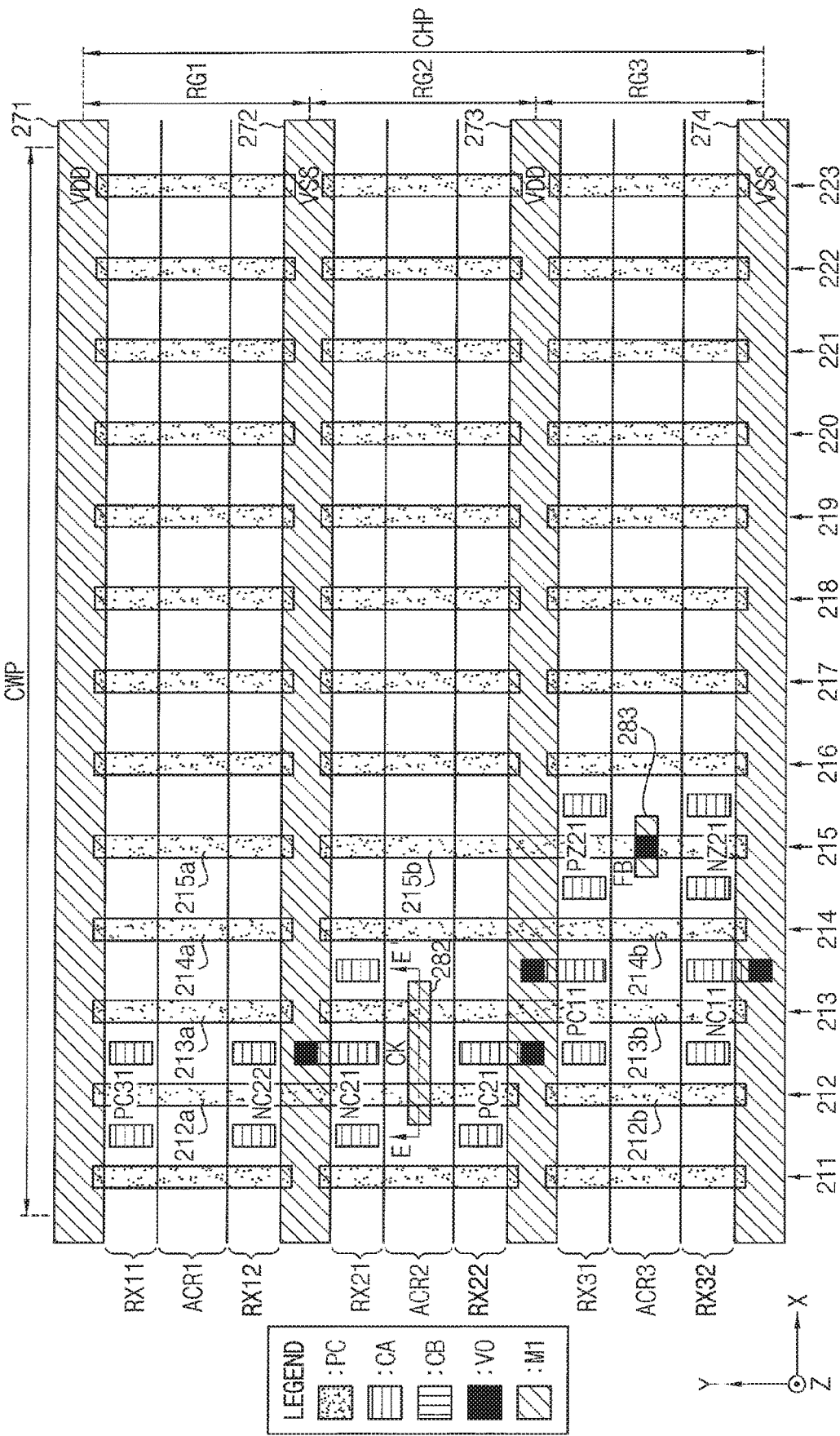
FIGS. 13A and 13B are diagrams illustrating an exemplary embodiment of a layout of arranging the clock transistors and the feedback transistors in FIG. 11.
Figure 13B:
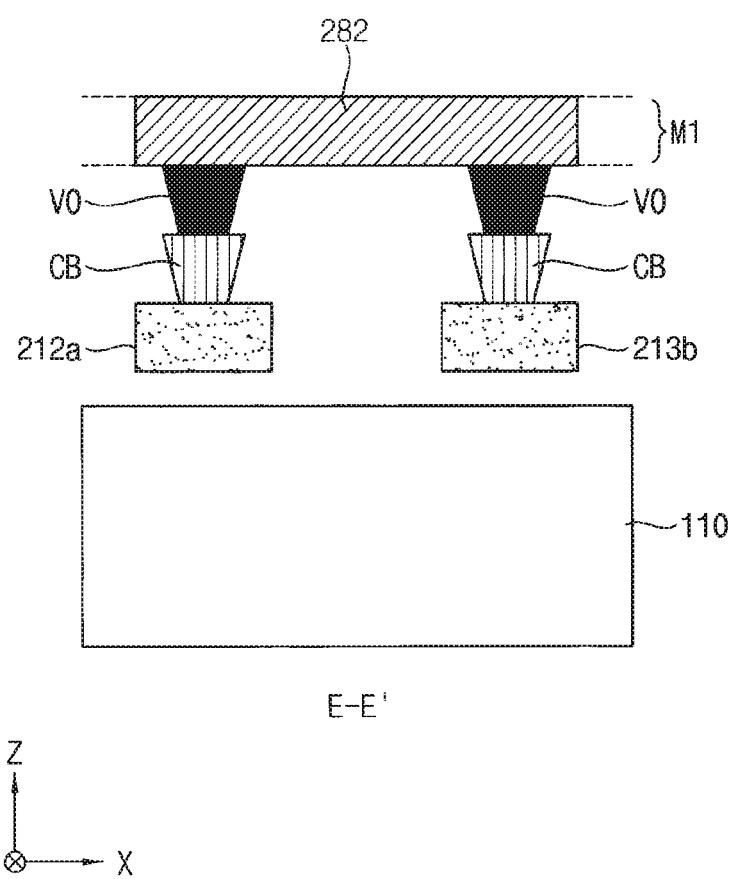

FIGS. 13A and 13B are diagrams illustrating an exemplary embodiment of a layout of arranging the clock transistors and the feedback transistors in FIG. 11. FIG. 13B is a cross-sectional view of FIG. 13A along line E-E'. For convenience of explanation, a further description of elements and aspects previously described with reference to FIGS. 11 and 12A are omitted.

Referring to FIGS. 11, 13A and 13B, the gate line includes two gate segments 212a and 212b, the gate line 213 includes two gate segments 213a and 213b, the gate line 214 includes two gate segments 214a and 214b, and the gate line 215 includes two gate segments 215a and 215b.

The gate segment 212a corresponds to a first clock gate line, the gate segment 213b corresponds to a second clock gate line, and the gate segment 215b corresponds to a feedback gate line.

The first clock gate line 212a extends in the second direction Y to pass through the first region RG1 and the second region RG2 and receives the input clock signal CK. The second clock gate line 213b extends in the second direction Y to pass through the second region RG2 and the third region RG3 and receives the input clock signal CK. The second clock gate line 213b is adjacent to the first clock gate line 212a in the first direction X.

The first clock gate line 212a forms a gate electrode of the clock transistor PC31 formed in the first region RG1 and included in the output circuit 1500, a gate electrode of the clock transistor NC22 formed in the first region RG1 and included in the second circuit 1300, and gate electrodes of the clock transistors NC21 and PC21 formed in the second region RG2 and included in the second circuit 1300. The second clock gate line 213b forms gate electrodes of the clock transistors NC11 and PC11 formed in the third region RG3 and included in the first circuit 1100.

Referring to FIGS. 13A and 13B, the first clock gate line 212a and the second clock gate line 213b may be electrically connected to each other through a gate connection wiring 282. The gate connection wiring 282 may be formed in the metal layer M1 in the second region RG2 and extend in the first direction X.

Hereinafter, with reference to FIGS. 14 through 23, other nodes of the standard cell corresponding to the semi-dynamic flip-flop will be described. For convenience of explanation, a further description of elements and aspects described with reference to FIGS. 11 and 12A may be omitted.

Figure 14:
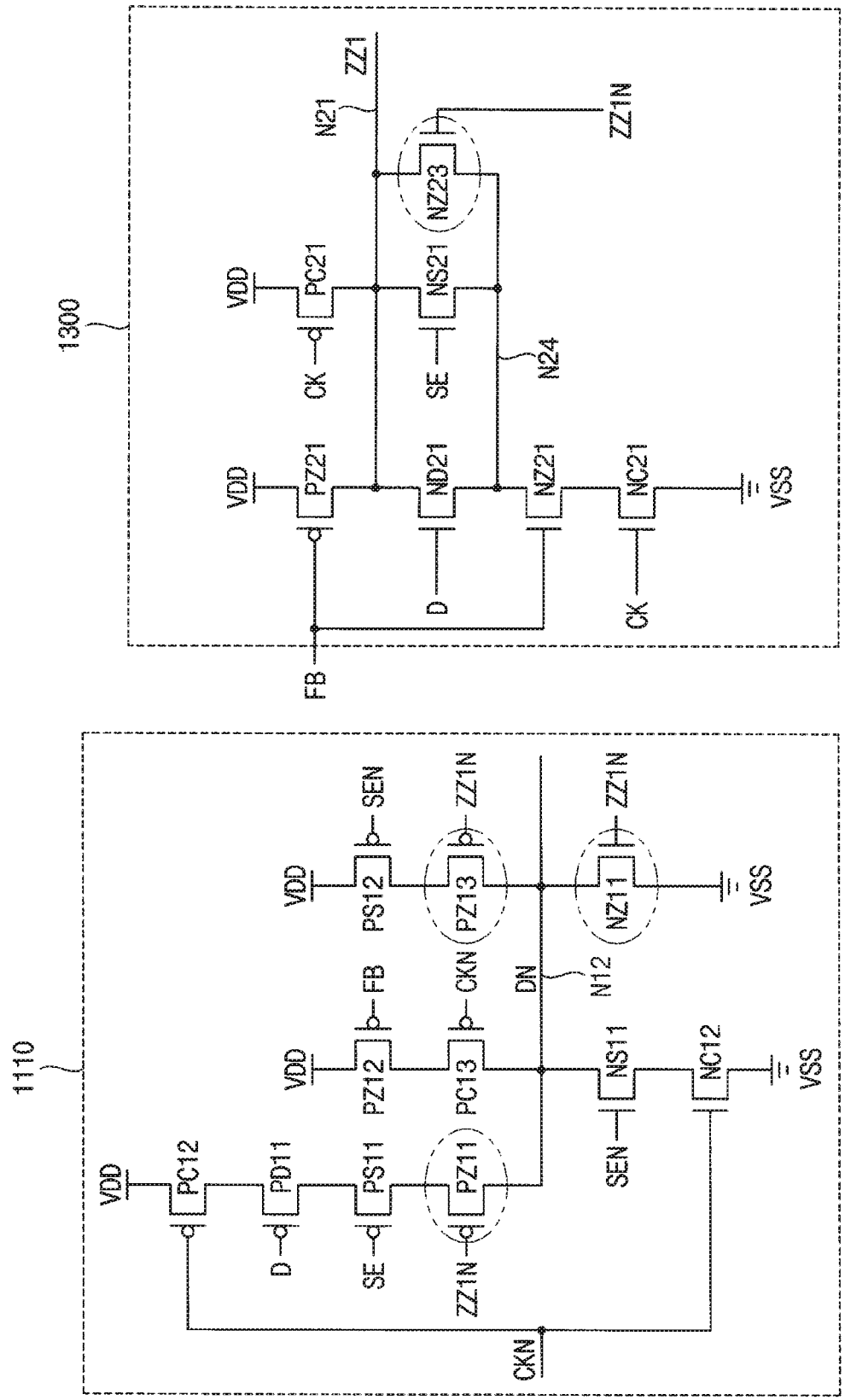
FIG. 14 is a diagram illustrating an example of feedback transistors included in a semi-dynamic flip-flop according to exemplary embodiments.
Figure 15:
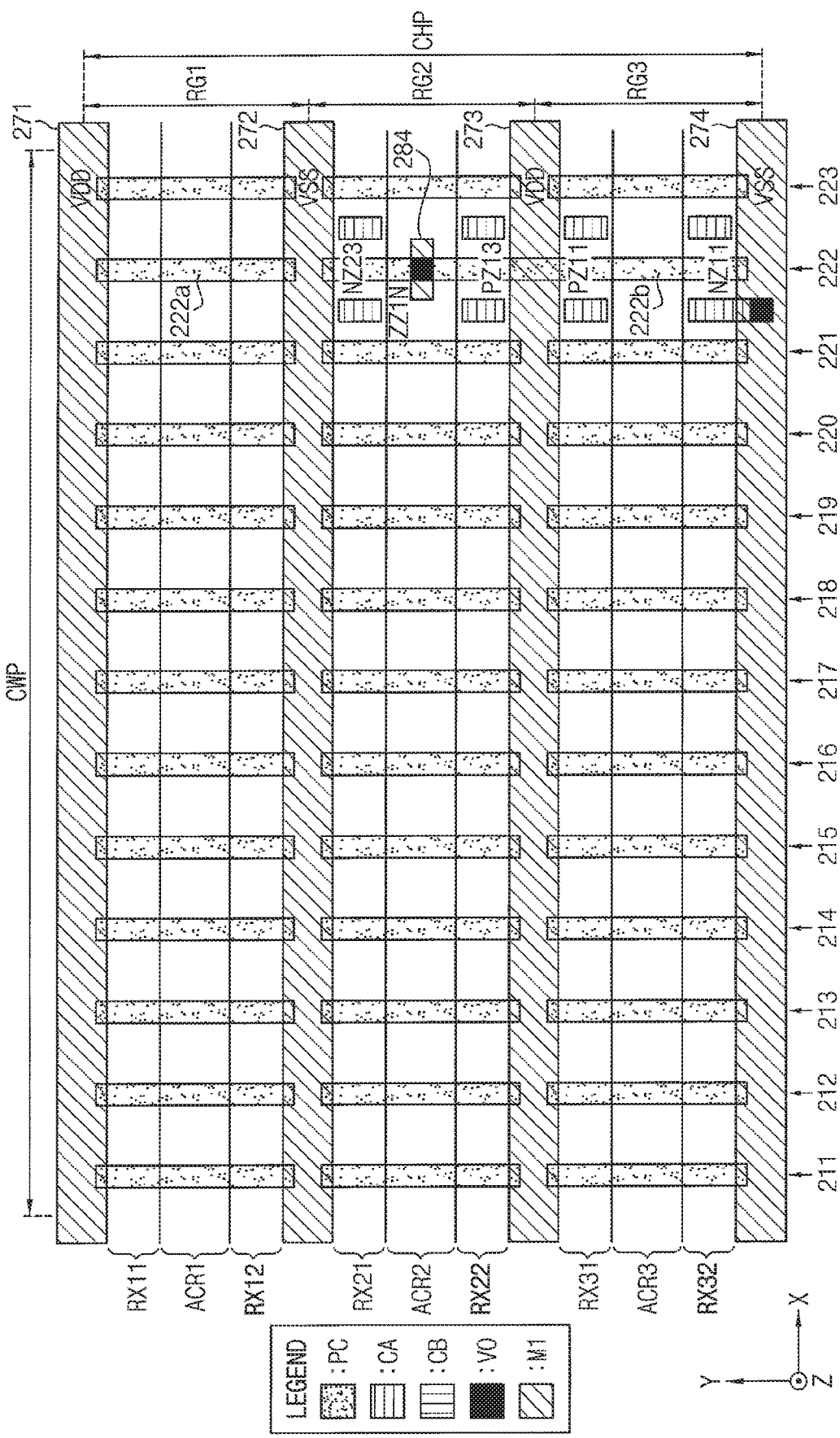
FIG. 15 is a diagram illustrating an exemplary embodiment of a layout of arranging the feedback transistors in FIG. 14.

FIG. 14 is a diagram illustrating an example of feedback transistors included in a semi-dynamic flip-flop according to exemplary embodiments. FIG. 15 is a diagram illustrating an exemplary embodiment of a layout of arranging the feedback transistors in FIG. 14.

FIG. 14 illustrates a portion of the transistors of FIGS. 5 and 6. FIG. 15 illustrates an exemplary embodiment of a layout of the feedback transistors PZ11, PZ13, NZ11, and NZ23, which are indicated by the dotted circles in FIG. 14.

Referring to FIGS. 14 and 15, the gate line 222 includes two gate segments 222a and 222b. The gate segment 222b corresponds to a feedback gate line.

The feedback gate line 222b extends in the second direction Y to pass through the second region RG2 and the third region RG3. The feedback gate line 222b receives the second feedback signal ZZ1N applied through the metal wiring 284. The feedback gate line 222b forms gate electrodes of the feedback transistors PZ11, PZ13 and NZ11 included in the first circuit 1100, and a gate electrode of the feedback transistor NZ23 included in the second circuit 1300, which are formed in the second region RG2 and the third region RG3.

Figure 16:
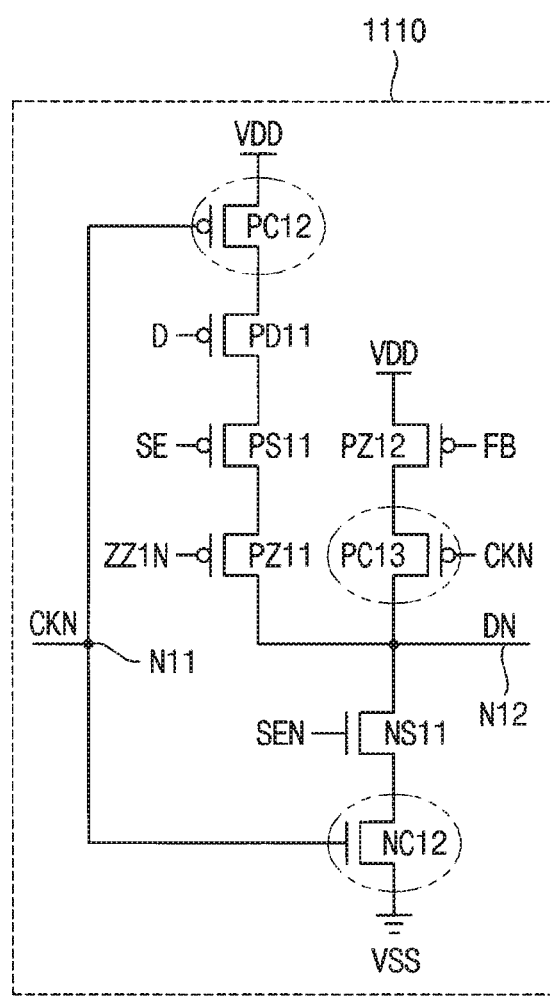
FIG. 16 is a diagram illustrating an example of inversion clock transistors included in a semi-dynamic flip-flop according to exemplary embodiments.
Figure 17:
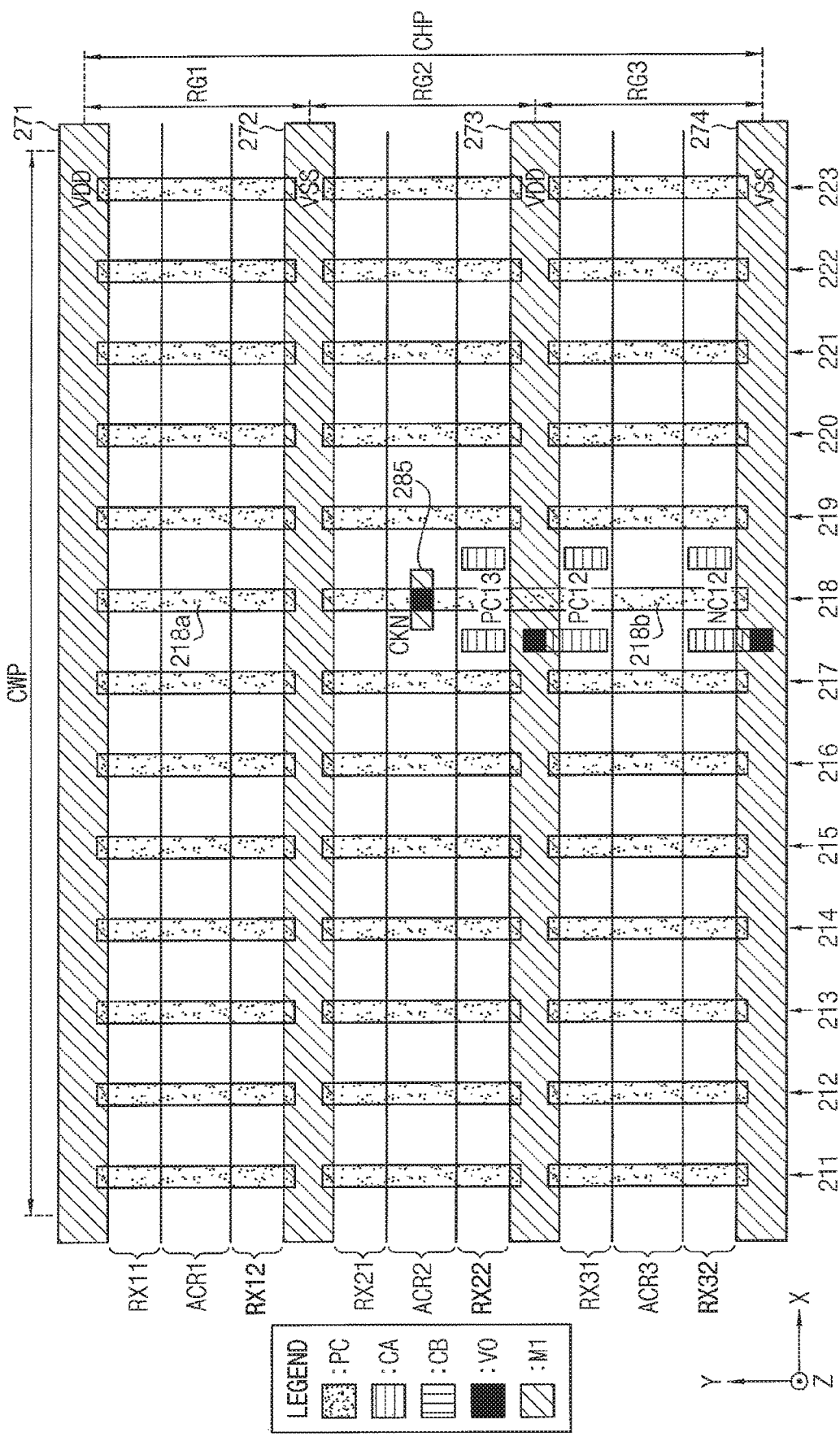
FIG. 17 is a diagram illustrating an exemplary embodiment of a layout of arranging the inversion clock transistors in FIG. 16.

FIG. 16 is a diagram illustrating an example of inversion clock transistors included in a semi-dynamic flip-flop according to exemplary embodiments. FIG. 17 is a diagram illustrating an exemplary embodiment of a layout of arranging the inversion clock transistors in FIG. 16.

FIG. 16 illustrates a portion of the transistors of FIG. 5. FIG. 17 illustrates an exemplary embodiment of a layout of the inversion clock transistors PC12, PC13 and NC12, which are indicated by the dotted circles in FIG. 16.

Referring to FIGS. 16 and 17, the gate line 218 includes two gate segments 218a and 218b. The gate segment 218b corresponds to an inversion clock gate line.

The inversion clock gate line 218b extends in the second direction Y to pass through the second region RG2 and the third region RG3. The inversion clock gate line 218b receives the inverted clock signal CKN applied through the metal wiring 285. The inversion clock gate line 218b forms gate electrodes of the inversion clock transistors PC12, PC13 and NC12 included in the first circuit 1100, which are formed in the second region RG2 and the third region RG3.

Figure 18:
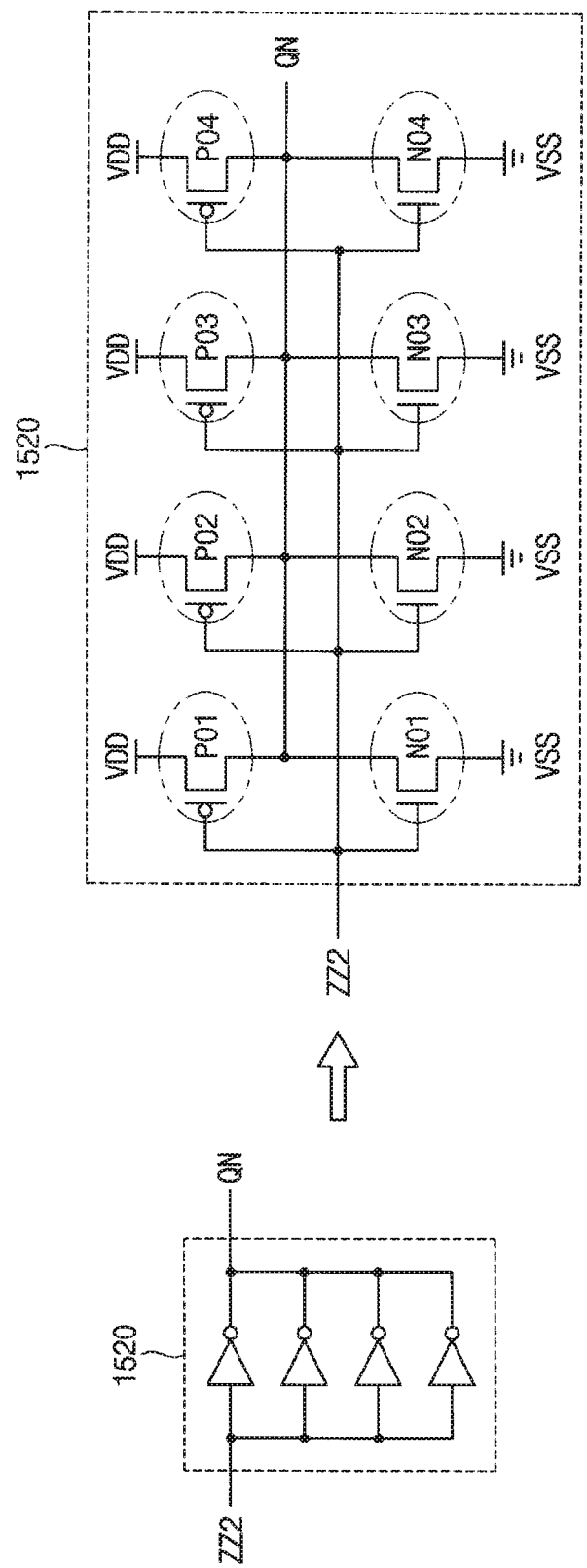
FIG. 18 is a diagram illustrating an example of an output buffer included in a semi-dynamic flip-flop according to exemplary embodiments.
Figure 19:
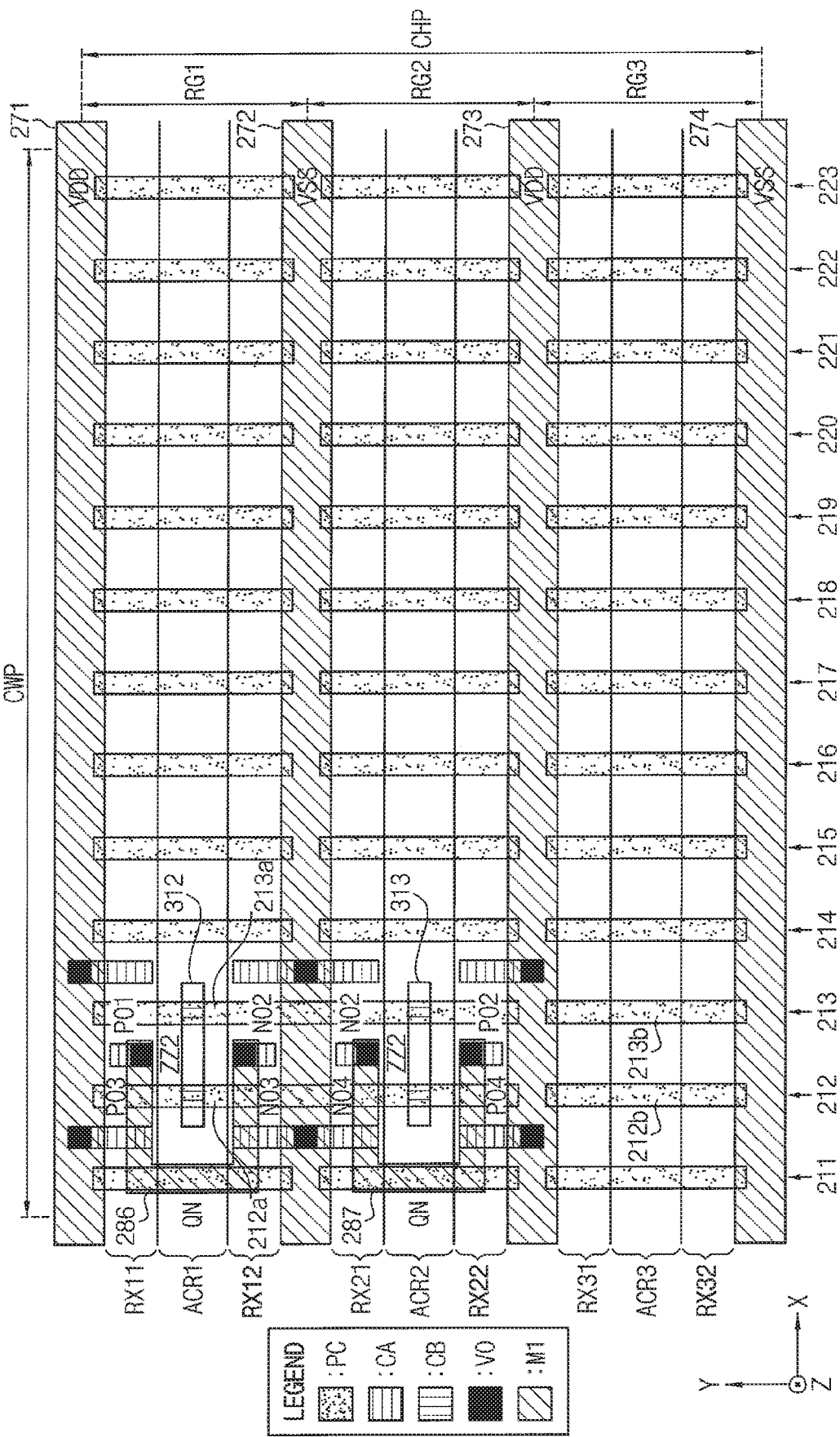
FIG. 19 is a diagram illustrating an exemplary embodiment of a layout of arranging transistors included in the output buffer in FIG. 18.

FIG. 18 is a diagram illustrating an example of an output buffer included in a semi-dynamic flip-flop according to exemplary embodiments. FIG. 19 is a diagram illustrating an exemplary embodiment of a layout of arranging transistors included in the output buffer in FIG. 18.

FIG. 18 illustrates inverter transistors P01-P04 and N01-N04 included in the output buffer 1520. FIG. 19 illustrates an exemplary embodiment of a layout of the inverter transistors P01-P04 and N01-N04, which are indicated by the dotted circles in FIG. 18.

Referring to FIGS. 18 and 19, the output buffer 1520 may include a plurality of inverters connected in parallel between the node generating the latch input signal ZZ2 of the latch circuit 1510 and an output node generating the output signal QN. The output buffer 1520 may include a various number of inverters depending on a required driving strength.

Although FIGS. 18 and 19 illustrate four inverters connected in parallel as an example, exemplary embodiments are not limited thereto.

The gate line 212 includes two gate segments 212a and 212b, and the gate line 213 includes two gate segments 213a and 213b. The gate segment 212a corresponds to a first inverter gate line and the gate segment 213a corresponds to a second inverter gate line.

The first inverter gate line 212a extends in the second direction Y to pass through the first region RG1 and the second region RG2 and receives the latch input signal ZZ2. The second inverter gate line 213a is adjacent to the first inverter gate line 212a in the first direction X. The second inverter gate line 213a extends in the second direction Y to pass through the first region RG1 and the second region RG2, and receives the latch input signal ZZ2. The first inverter gate line 212a and the second inverter gate line 213a form gate electrodes of the inverter transistors included in the plurality of inverters P01-P04 and N01-N04.

The first inverter gate line 212a and the second inverter gate line 213a may be electrically connected through a first gate connection via 312 and a second gate connection via 313. As described with reference to FIG. 12B, the first gate connection via 312 may be formed in the first region RG1 under the lowest metal layer M1 and extend in the first direction X, and second gate connection via 313 may be formed in the second region RG2 under the lowest metal layer M1 and extend in the first direction X.

The drain regions of the p-channel metal oxide semiconductor (PMOS) transistors P01-P04 and the drain regions of the n-channel metal oxide semiconductor (NMOS) transistors N01-N04 may be electrically connected through drain connection wirings 286 and 287. The drain connection wirings 286 and 287 may be electrically connected to each other through an upper metal wiring.

Figure 20:
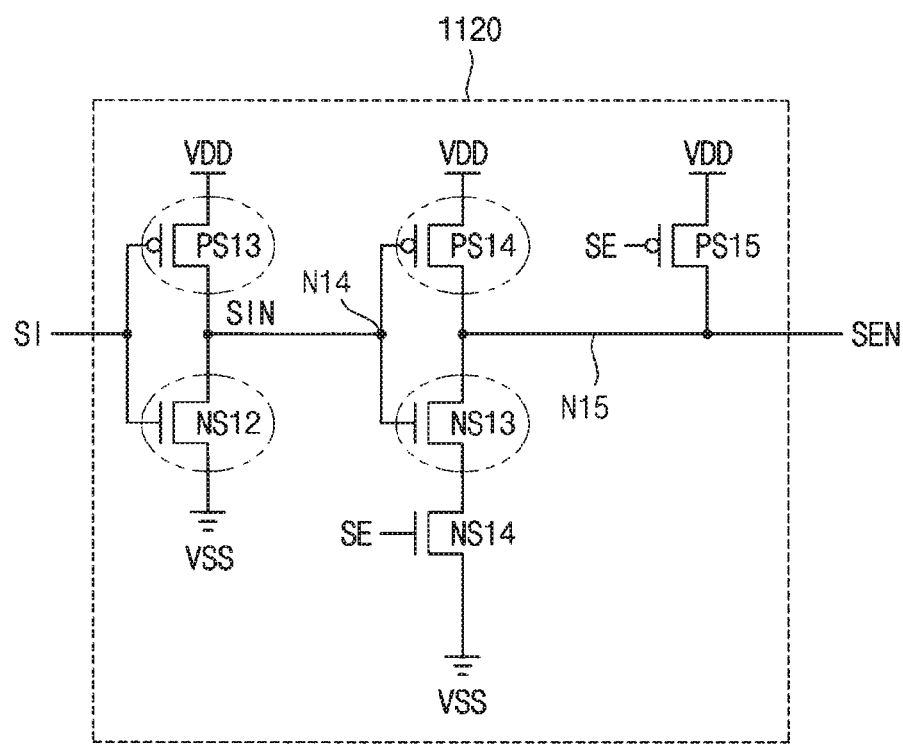
FIG. 20 is a diagram illustrating an example of scan input transistors included in a semi-dynamic flip-flop according to exemplary embodiments.
Figure 21:
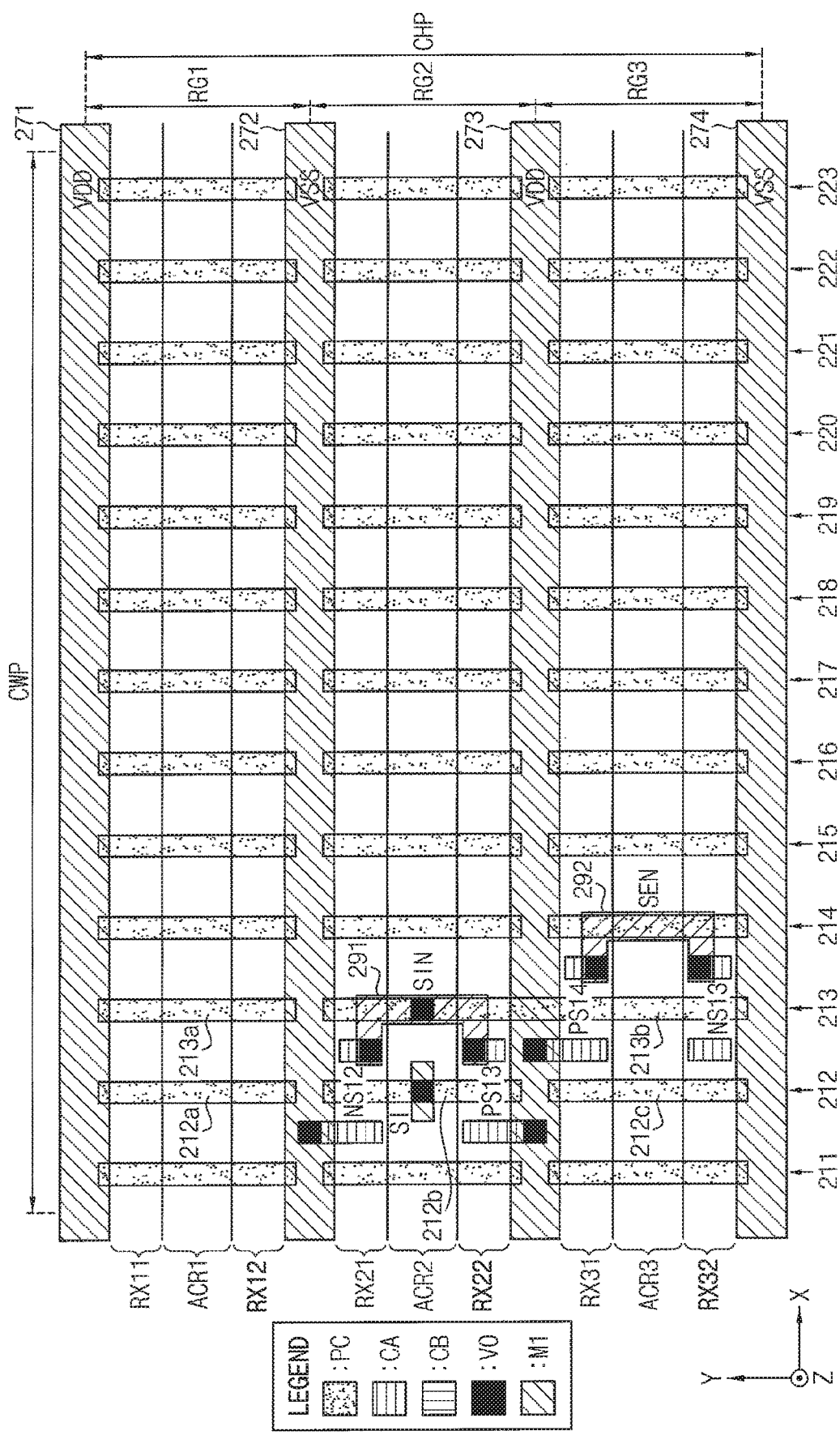
FIG. 21 is a diagram illustrating an exemplary embodiment of a layout of arranging the scan input transistors in FIG. 20.

FIG. 20 is a diagram illustrating an example of scan input transistors included in a semi-dynamic flip-flop according to exemplary embodiments. FIG. 21 is a diagram illustrating an exemplary embodiment of a layout of arranging the scan input transistors in FIG. 20.

FIG. 20 illustrates a portion of the transistors of FIG. 5. FIG. 21 illustrates an exemplary embodiment of a layout of the scan input transistors PS13, PS14, NS12 and NS13, which are indicated by the dotted circles in FIG. 20.

Referring to FIGS. 20 and 21, the gate line 212 includes three gate segments 212a, 212b and 212c, and the gate line 213 includes two gate segments 213a and 213b. The gate segment 212b corresponds to a scan input gate line and the gate segment 213b corresponds to an inversion scan input gate line.

The scan input gate line 212b extends in the second direction Y to pass through the second region RG2 and receives the scan input signal SI. The scan input gate line 212b forms gate electrodes of the scan input transistors NS12 and PS13 in the second region RG2 that invert the scan input signal SI to generate an inverted scan input signal SIN.

The inversion scan input gate line 213b is adjacent to the scan input gate line 212b in the first direction X. The inversion scan input gate line 213b extends in the second direction Y to pass through the second region RG2 and the third region RG3. The inversion scan input gate line 213b forms gate electrodes of the scan input transistors PS14 and NS13 in the third region RG3 that invert the inverted scan input signal SIN to generate a delayed scan input signal SEN.

The drain regions of the scan input transistors NS12 and PS13 in the second region RG2 and the inversion scan input gate line 213b may be electrically connected to each other through a wiring 291. The drain regions of the scan input transistors PS14 and NS13 in the third region RG3 may be electrically connected to each other through a wiring 292.

Figure 22:
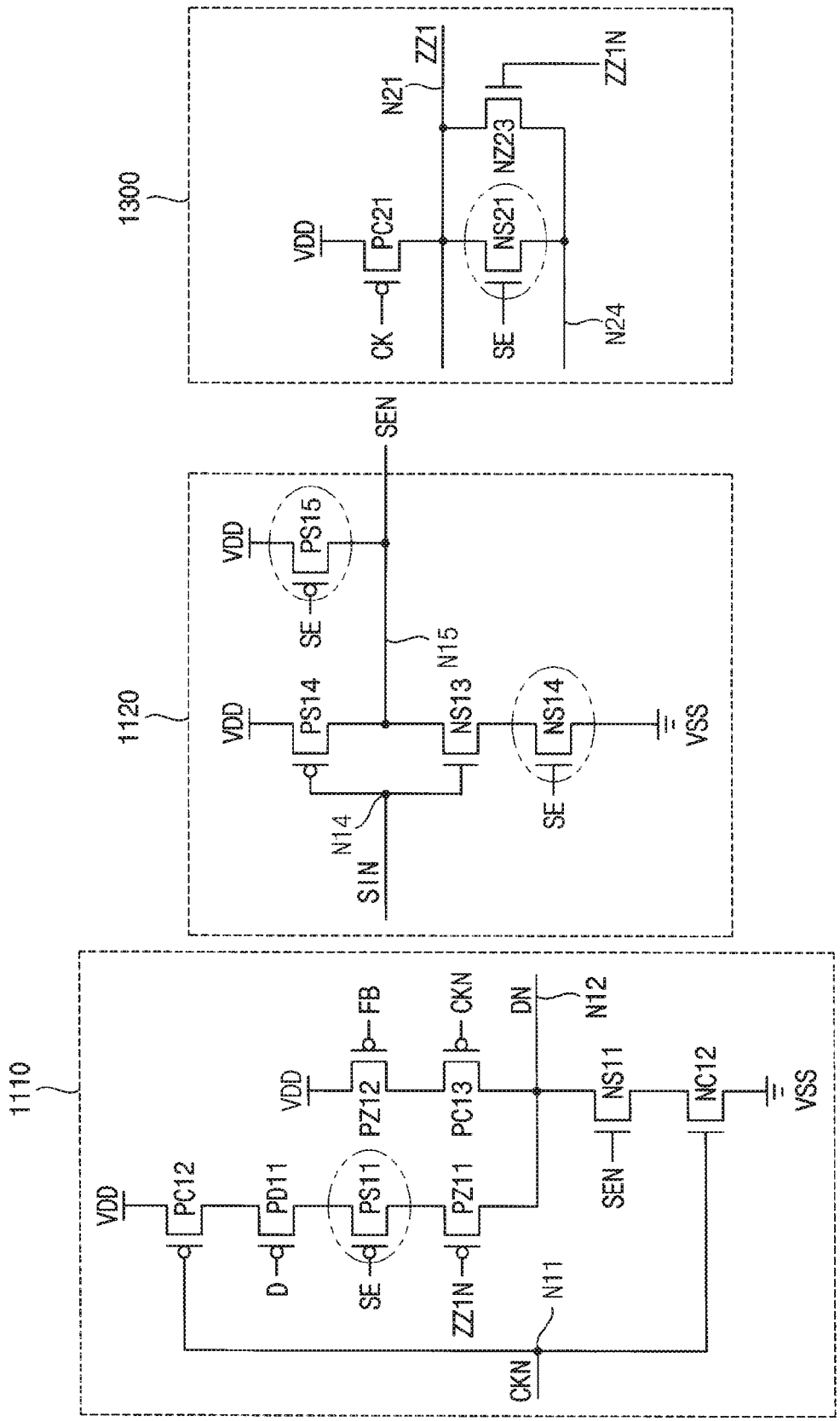
FIG. 22 is a diagram illustrating an example of scan enable transistors included in a semi-dynamic flip-flop according to exemplary embodiments.
Figure 23:
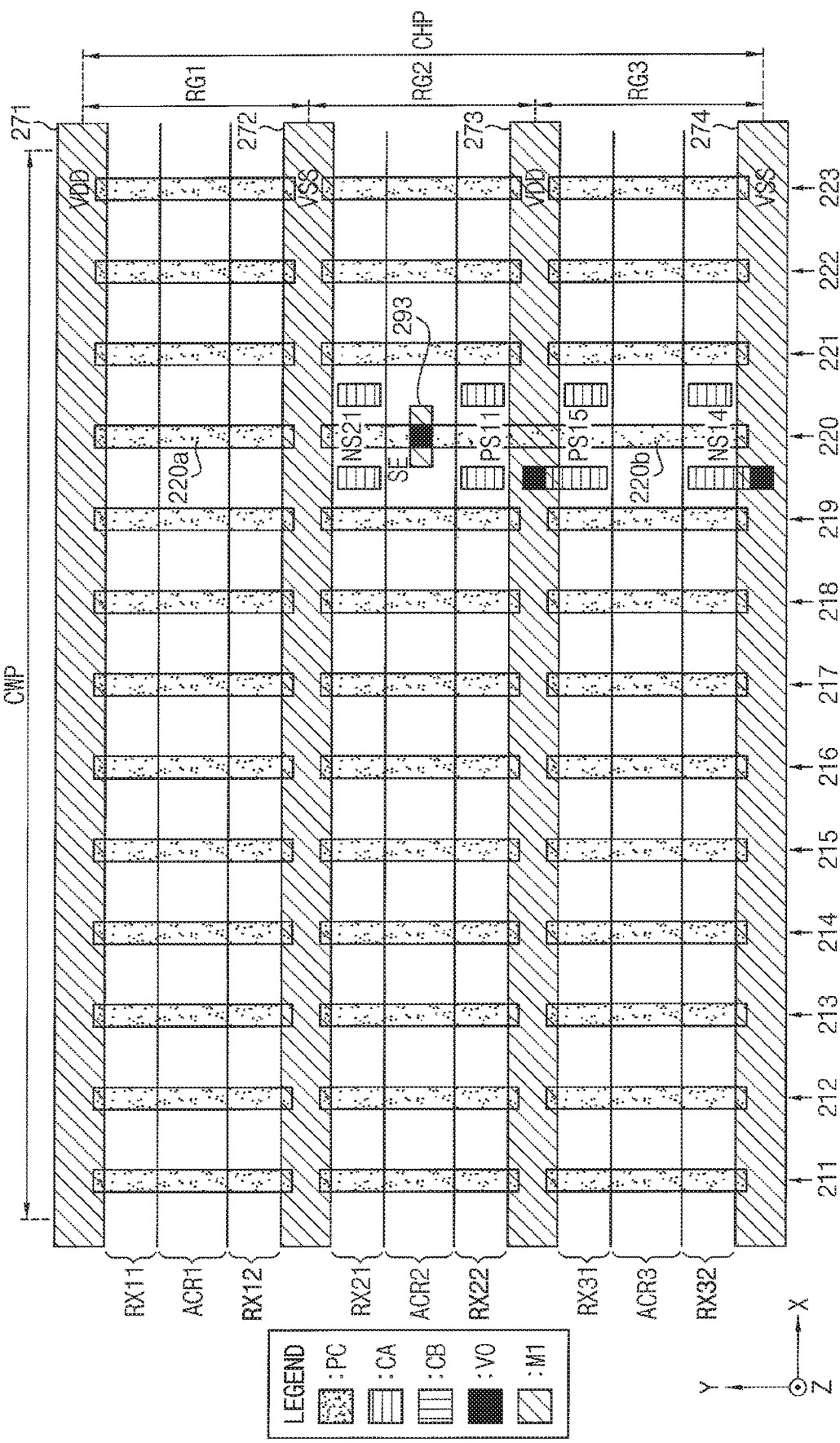
FIG. 23 is a diagram illustrating an exemplary embodiment of a layout of arranging the scan enable transistors in FIG. 22.

FIG. 22 is a diagram illustrating an example of scan enable transistors included in a semi-dynamic flip-flop according to exemplary embodiments. FIG. 23 is a diagram illustrating an exemplary embodiment of a layout of arranging the scan enable transistors in FIG. 22.

FIG. 22 illustrates a portion of the transistors of FIGS. 5 and 6. FIG. 23 illustrates an exemplary embodiment of a layout of the feedback transistors PS11, PS15, NS14 and NS21, which are indicated by the dotted circles in FIG. 22.

Referring to FIGS. 14 and 15, the gate line 220 includes two gate segments 220a and 220b. The gate segment 220b corresponds to a scan enable gate line.

The scan enable gate line 220b extends in the second direction Y to pass through the second region and the third region and receives the scan enable signal SE that is applied through a metal wiring 293. The scan enable gate line 220b forms gate electrodes of the scan enable transistors PZ11, PZ13 and NZ11 included in the first circuit 1100, and gate electrodes of the scan enable transistors PS11, PS15 and NS14 included in the first circuit 1100 and a gate electrode of the scan enable transistor NS21 included in the second circuit 1300, which are formed in the second region RG2 and the third region RG3.

As described above, the semi-dynamic flip-flop and the method of designing the semi-dynamic flip-flop according to exemplary embodiments may improve an operation and reduce power consumption by implementing the semi-dynamic flip-flop as a multi-height standard cell having an efficient arrangement of nodes that significantly affect the power consumption. In addition, unnecessary metal wirings may be removed by arranging the same nodes or the correlated nodes and connecting the nodes using the gate lines, and thus, efficiency of design may be improved.

Figure 24A:
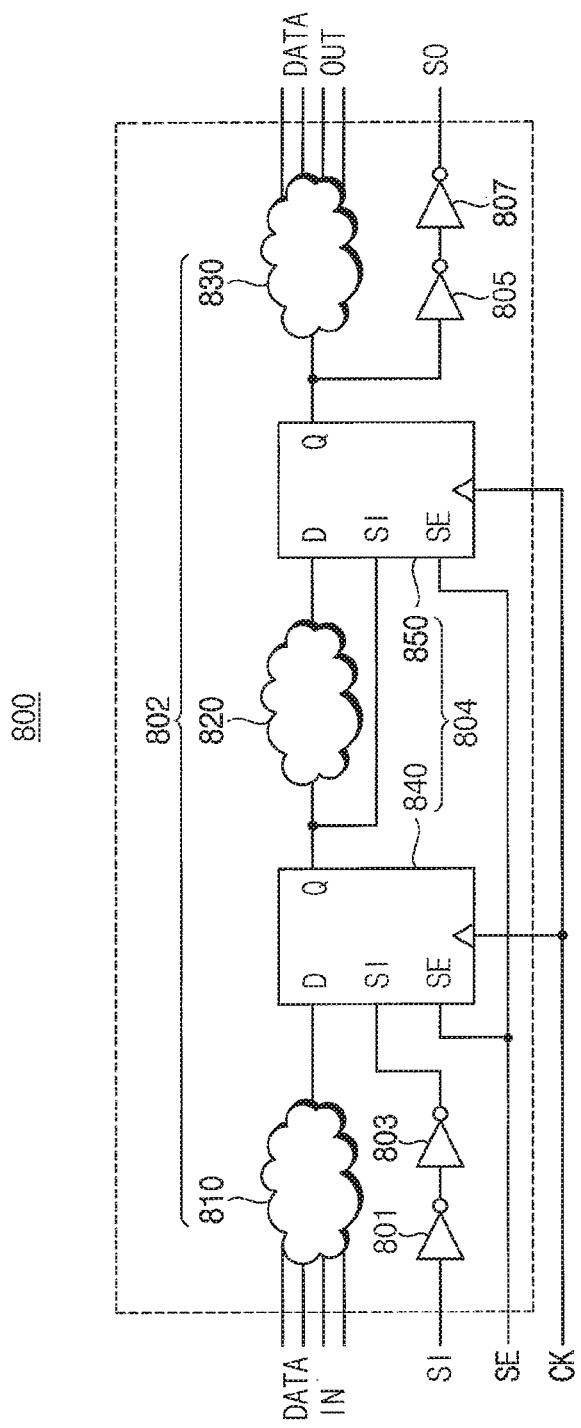
FIGS. 24A and 24B are diagrams illustrating a scan test circuit including a semi-dynamic flip-flop according to exemplary embodiments.
Figure 24B:
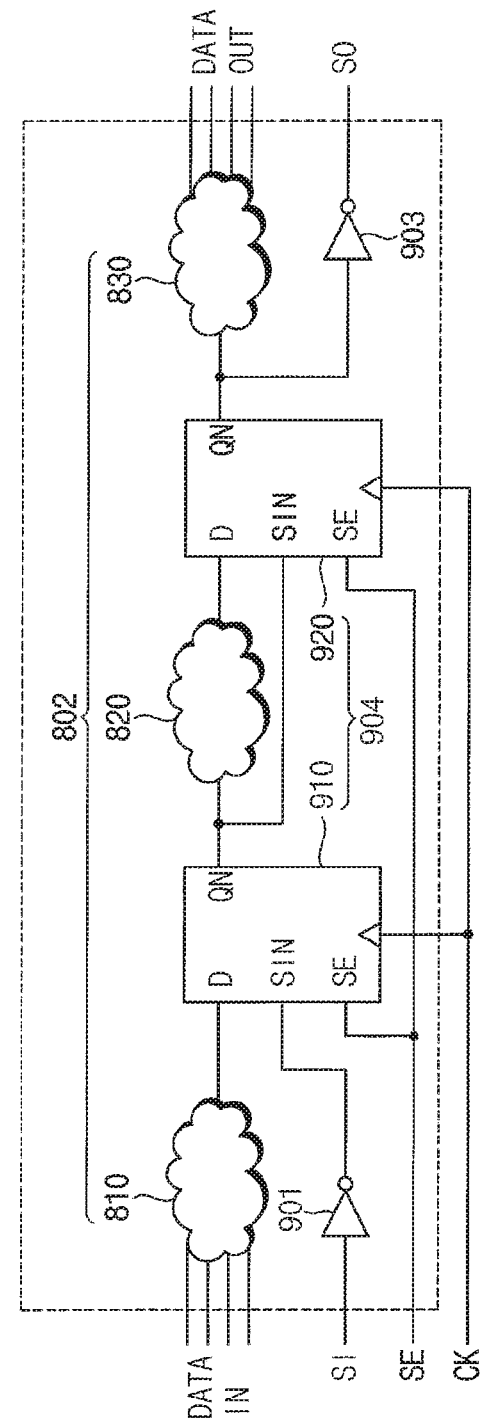

FIGS. 24A and 24B are diagrams illustrating a scan test circuit including a semi-dynamic flip-flop according to exemplary embodiments.

Device for Testability (DFT) schemes for testing semiconductor chips are widely used. Among the DFT schemes, a scan test scheme may be used to efficiently test semiconductor integrated circuits. A flip-flop having a scan input is designed for a convenient test of logic circuits. According to the scan test scheme, flip-flops in the logic circuit may form a shift register in a scan test mode, and a scan input may be applied to the shift register to observe a resulting output.

FIG. 24A illustrates a scan test circuit using a scan input signal SI. FIG. 24B illustrates a scan test circuit using an inverted scan input signal SIN.

Referring to FIG. 24A, a scan test circuit 800 may include combination circuitry 802, sequential circuitry 804 and inverters 801, 803, 805 and 807. The combination circuitry 802 may include a plurality of logic circuits 810, 820 and 830. The sequential circuitry 804 may include a plurality of flip-flops including a first flip-flop 840 and a second flip-flop 850.

The first logic circuit 810 performs a logic operation on data DATA IN and provides input data D of the first flip-flop 840. The first flip-flop 840 operates in synchronization with an input clock signal CK. A logic level of a scan enable signal SE may represent a normal mode or a scan test mode. The first flip-flop 840 provides output data Q corresponding to the input data D in the normal mode, and provides output data Q corresponding to the scan input signal SI in the scan test mode. The second logic circuit 820 performs a logic operation on the output data Q of the first flip-flop 840 and provides input data D of the second flip-flop 850.

The second flip-flop 850 receives the output data Q of the first flip-flop as a scan input SI and receives the scan enable signal SE and the input clock signal CK. The third logic circuit 830 performs a logic operation on output data Q of the second flip-flop 850 and provides output data DATA OUT. The output data Q of the second flip-flop 850 may be provided as a scan output SO through the inverters 805 and 807 in the scan test mode.

Referring to FIG. 24B, a scan test circuit 900 may include combination circuitry 802, sequential circuitry 904 and inverters 901 and 903. The combination circuitry 802 may include a plurality of logic circuits 810, 820 and 830. The sequential circuitry 904 may include a plurality of flip-flops including a first flip-flop 910 and a second flip-flop 920. The scan test circuit 900 of FIG. 24B is similar to the scan test circuit 800 of FIG. 24A, except that the first flip-flop 910 and the second flip-flop 920 in the scan test circuit 900 of FIG. 24B receive an inverted scan input signal SIN and output inversion output data QN. For convenience of explanation, a further description of elements and aspects previously described with reference to FIG. 24A is omitted.

The scan flip-flops included in the scan test circuits in FIGS. 24A and 24B may provide the output data corresponding to the scan input data SI in the scan test mode. In addition, the scan test circuits of FIGS. 24A and 24B may perform the logic operations of the input data DATA IN to provide the output data DATA OUT in the normal mode, and form a scan test path provide the scan output signal SO corresponding to the scan input signal SI to test the operation of the scan test circuit.

Figure 25:
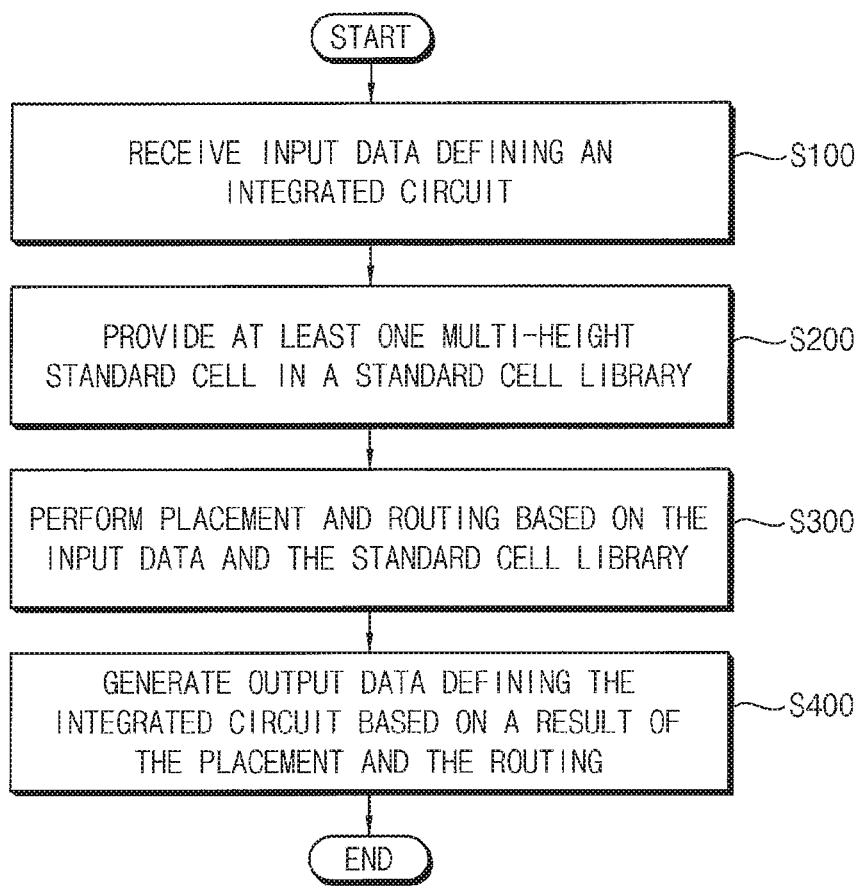
FIG. 25 is a diagram illustrating a method of designing an integrated circuit according to exemplary embodiments.

FIG. 25 is a diagram illustrating a method of designing an integrated circuit according to exemplary embodiments.

The method of FIG. 25 may include a method of designing a layout of the integrated circuit that is performed by a designing tool. In exemplary embodiments, the designing tool may include programming software including a plurality of instructions executable by a processor, for example, software implemented in some form of hardware (e.g. processor, ASIC, etc.).

Referring to FIG. 25, input data defining the integrated circuit may be received (S100). For example, an integrated circuit may be defined by a plurality of cells, and the integrated circuit may be designed using a cell library including information about the cells. Hereinafter, a cell may be a standard cell and a cell library may be a standard cell library.

In exemplary embodiments, the input data may be data generated from an abstract form with respect to behavior of the integrated circuit. For example, the input data may be defined in a register transfer level (RTL) through synthesis using the standard cell library. For example, the input data may be a bitstream and/or a netlist that are generated by synthesizing the integrated circuit defined by a hardware description language (HDL) such as, for example, VHSIC hardware description language (VHDL) or Verilog.

In exemplary embodiments, the input data may be data for defining the layout of the integrated circuit. For example, the input data may include geometric information for defining a structure implemented as a semiconductor material, a metal, and an insulator. A layout of the integrated circuit indicated by the input data may have, for example, a layout of the cells and conducting wires used to connect a cell to other cells.

At least one multi-height standard cell is provided in a standard cell library (S200). The term "standard cell" may refer to a unit of an integrated circuit in which a size of the layout meets a preset or specified rule. The standard cell may include an input pin and an output pin, and may process a signal received through the input pin to output a signal through the output pin. For example, the standard cell may be a basic cell such as an AND logic gate, an OR logic gate, a NOR logic gate, or an inverter, a complex cell such as an OR/AND/INVERTER (OAI) or an AND/OR/INVERTER (AOI), or a storage element such as a master-slave flip-flop or a latch.

The multi-height standard cell may correspond to a semi-dynamic flip-flop including the efficient routing structure using gate lines and the transistor arrangement based on the routing structure according to exemplary embodiments as described with reference to FIGS. 1 through 23.

The standard cell library may include information about a plurality of standard cells. For example, the standard cell library may include a name and a function of a standard cell, as well as timing information, power information, and layout information about the standard cell. The standard cell library may be stored in a storage device and the standard cell library may be provided by accessing the storage device.

Placement and routing are performed based on the input data and the standard cell library (S300), and output data defining the integrated circuit are provided based on a result of the placement and the routing (S400).

In exemplary embodiments, when the received input data are data such as the bitstream or the netlist generated by synthesizing the integrated circuit, the output data may be the bitstream or the netlist. In exemplary embodiments, when the received input data are data defining the layout of the integrated circuit, for example, the data having a graphic data system II (GDSII) format, a format of the output data may also be data defining the layout of the integrated circuit.

Figure 26:
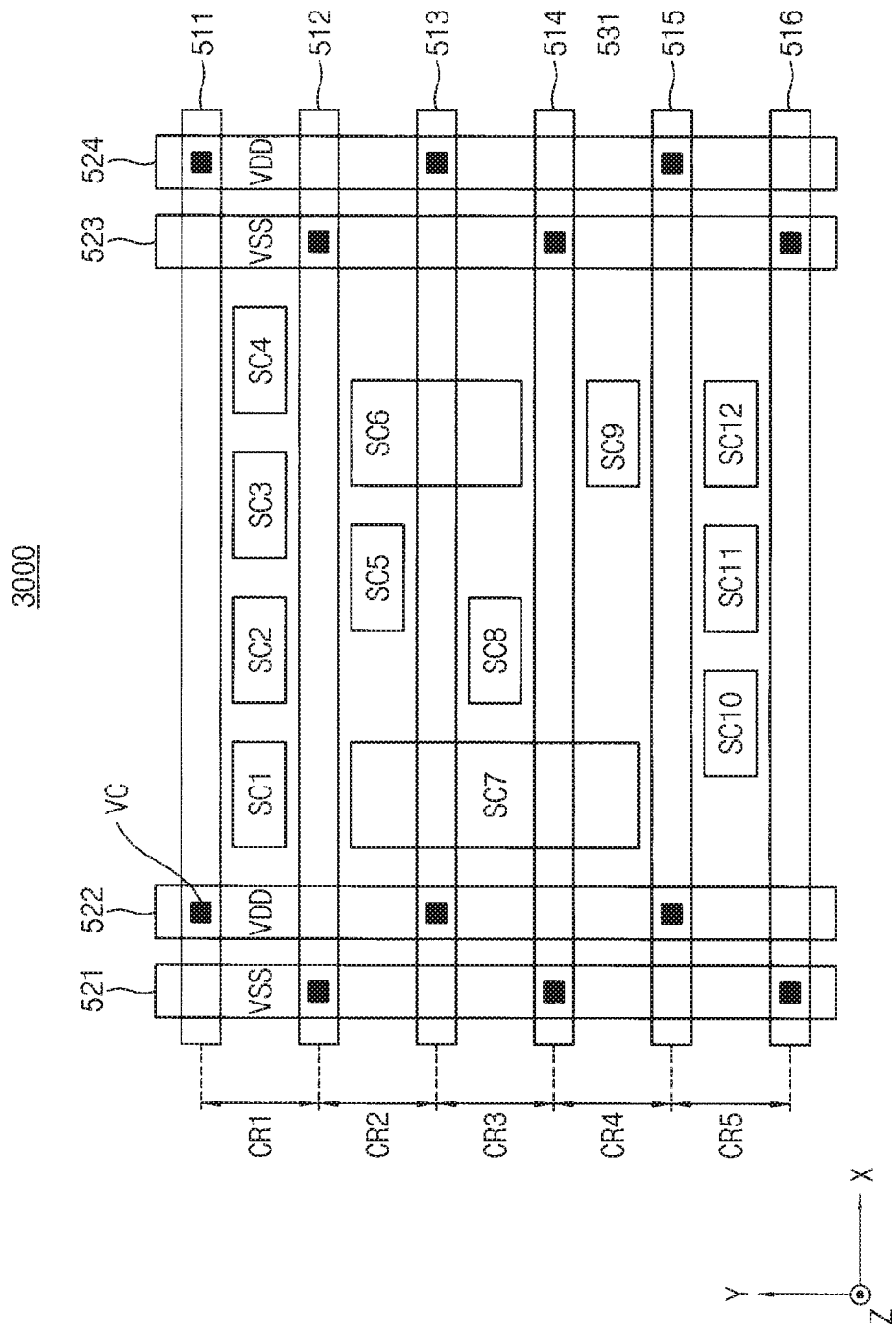
FIG. 26 is a diagram illustrating a layout of an integrated circuit according to exemplary embodiments.

FIG. 26 is a diagram illustrating a layout of an integrated circuit according to exemplary embodiments.

An integrated circuit 3000 of FIG. 26 may be, for example, an application specific integrated circuit (ASIC). A layout of the integrated circuit 3000 may be determined by performing the above-described placement and routing of standard cells SC1-SC12. Power may be provided to the standard cells SC1-SC12 through power rails 511-516. The power rails 511-516 may include high power rails 511, 513, and 515 to provide a first power supply voltage VDD, and low power rails 512, 514, and 516 to provide a second power supply voltage VSS lower than the first power supply voltage VDD. For example, the first power supply voltage VDD may be a power supply voltage having a positive voltage level, and the second power supply voltage VSS may be a ground voltage having a ground level (e.g., 0 V) or a negative voltage level.

The high power rails 511, 513, and 515, and the low power rails 512, 514, and 516 extend in the first direction X and are arranged alternatively one by one in the second direction Y to form boundaries of a plurality of circuit rows CR1-CR5 corresponding to the regions defined by the power rails 511-516 arranged in the second direction Y.

According to exemplary embodiments, power may be distributed to the power rails 511-516 through power mesh routes 521-524 that extend in the second direction Y. Some power mesh routes 522 and 524 may provide the first power supply voltage VDD and other power mesh routes 521 and 523 may provide the second power supply voltage VSS. The power mesh routes 521-524 may be connected to the power rails 511-516 through vertical contacts VC such as, for example, via contacts.

In general, each of the circuit rows CR1-CR5 may be connected to two adjacent power rails that are at boundaries thereof so as to be powered. For example, the standard cells SC1-SC4 in the first circuit row CR1 may be connected to an adjacent and corresponding power rail pair including the high power rail 511 and the low power rail 512.

For example, as illustrated in FIG. 26, the standard cell SC6 may be a double-height standard cell formed in the two circuit rows CR2 and CR3, and the standard cell SC7 may be a triple-height standard cell formed in the three circuit rows C2, C3 and C4. As a result, the area occupied by the integrated circuit 500 may be reduced, and the performance of the integrated circuit 300 may be improved by efficient routing of the single-height standard cells SC1-SC5 and SC8-SC12 and the multi-height standard cells SC6 and SC7.

Figure 27:
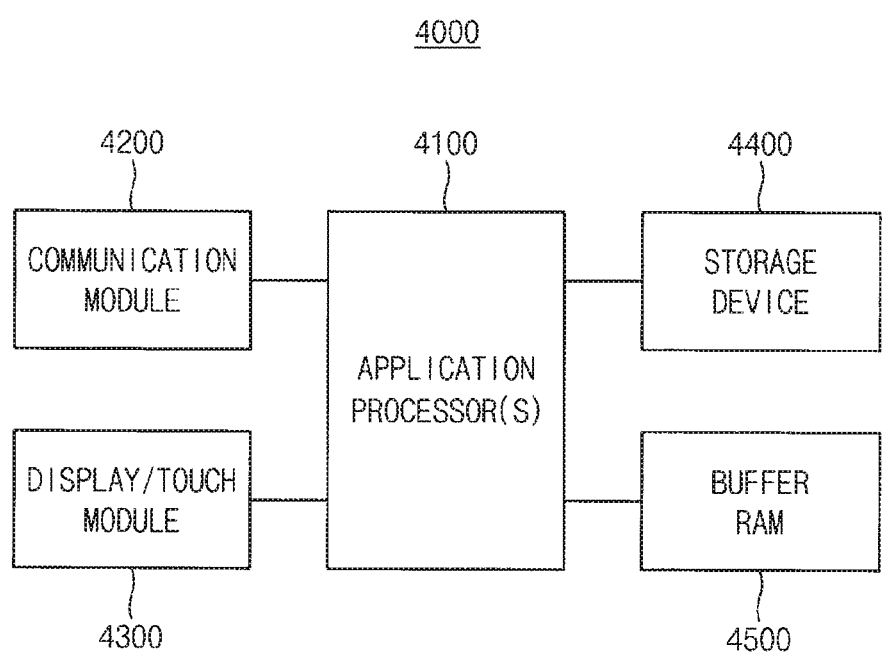
FIG. 27 is a block diagram illustrating a mobile device according to exemplary embodiments.

FIG. 27 is a block diagram illustrating a mobile device according to exemplary embodiments.

Referring to FIG. 27, a mobile device 4000 may include at least one application processor 4100, a communication module 4200, a display/touch module 4300, a storage device 4400, and a buffer RAM 4500.

The application processor 4100 may control operations of the mobile device 4000. The communication module 4200 is implemented to perform wireless or wired communications with an external device. The display/touch module 4300 is implemented to display data processed by the application processor 4100 and/or to receive data through a touch panel. The storage device 4400 is implemented to store user data. The storage device 4400 may be, for example, an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, rambus dynamic random access memory (RDRAM), etc.

At least one component in the mobile device 4000 may include at least one multi-height standard cell according to the exemplary embodiments described herein. As described above, a design of the multi-height standard cell may be included in the standard cell library, and integrated circuits included in the mobile device 4000 may be designed through automatic placement and routing by a design tool.

As is traditional in the field of the present inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

As will be appreciated by one skilled in the art, aspects of the present inventive concept may be embodied as a system, method or computer program product. Accordingly, aspects of the present inventive concept may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, aspects of the present inventive concept may take the form of a computer program product embodied in one or more computer readable medium(s) having computer readable program code embodied thereon.

Exemplary embodiments may be applied to any electronic devices and systems. For example, exemplary embodiments may be applied to systems such as a memory card, a solid state drive (SSD), an embedded multimedia card (eMMC), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of things (IoT) device, an Internet of everything (IoE) device, an e-book, a virtual reality (VR) device, an augmented reality (AR) device, etc.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semi-dynamic flip-flop, comprising:
a semiconductor substrate;
a first power rail, a second power rail, a third power rail, and a fourth power rail disposed on the semiconductor substrate, extending in a first direction, and arranged sequentially in a second direction substantially perpendicular to the first direction; and
at least one clock gate line disposed on the semiconductor substrate, and extending in the second direction to pass through at least two regions among a first region between the first power rail and the second power rail, a second region between the second power rail and the third power rail, and a third region between the third power rail and the fourth power rail,
wherein the at least one clock gate line receives an input clock signal,
wherein the semi-dynamic flip-flop comprises:
a first circuit configured to generate a first feedback signal based on an input data signal, the input clock signal, and a second feedback signal;
a second circuit configured to generate the second feedback signal and a latch input signal based on the input data signal, the input clock signal, and the first feedback signal; and
an output circuit configured to generate an output signal corresponding to the input data signal based on the input clock signal and the latch input signal.

2. The semi-dynamic flip-flop of claim 1, wherein the semi-dynamic flip-flop has a negative setup time to reflect a transition of an input signal after a transition of the input clock signal.

3. The semi-dynamic flip-flop of claim 1, wherein the at least one clock gate line comprises:
a first clock gate line extending in the second direction to pass through the first region and the second region; and
a second clock gate line extending in the second direction to pass through the second region,
wherein the second clock gate line is adjacent to the first clock gate line in the first direction.

4. The semi-dynamic flip-flop of claim 3, wherein the first clock gate line forms gate electrodes of clock transistors formed in the first region and included in the output circuit, and gate electrodes of clock transistors formed in the second region and included in the second circuit,
wherein the second clock gate line forms gate electrodes of clock transistors formed in the second region and included in the first circuit.

5. The semi-dynamic flip-flop of claim 3, wherein the first clock gate line is not cut by a gate cut region in the first region, the second region, and a boundary region between the first region and the second region.

6. The semi-dynamic flip-flop of claim 3, further comprising:
a gate connection via formed in the second region under a lowest metal layer, and extending in the first direction to electrically connect the first clock gate line and the second clock gate line.

7. The semi-dynamic flip-flop of claim 3, further comprising:
a feedback gate line extending in the second direction to pass through the second region and the third region,
wherein the feedback gate line is adjacent to the first clock gate line in the first direction such that the first clock gate line is disposed between the second clock gate line and the feedback gate line,
wherein the feedback gate line receives the first feedback signal.

8. The semi-dynamic flip-flop of claim 1, wherein the at least one clock gate line comprises:
a first clock gate line extending in the second direction to pass through the first region and the second region; and
a second clock gate line extending in the second direction to pass through the second region and the third region,
wherein the second clock gate line is adjacent to the first clock gate line in the first direction.

9. The semi-dynamic flip-flop of claim 8, further comprising:
a gate connection wiring formed in a metal layer in the second region and extending in the first direction to electrically connect the first clock gate line and the second clock gate line.

10. The semi-dynamic flip-flop of claim 1, further comprising:
a feedback gate line extending in the second direction to pass through the second region and the third region,
wherein the feedback gate line receives the second feedback signal.

11. The semi-dynamic flip-flop of claim 1, further comprising:
an inversion clock gate line extending in the second direction to pass through the second region and the third region,
wherein the inversion clock gate line receives an inverted clock signal that is inverted from the input clock signal.

12. The semi-dynamic flip-flop of claim 1, wherein the output circuit comprises:
   a latch circuit configured to latch the latch input signal; and
   a plurality of inverters connected in parallel between a node to which the latch input signal of the latch circuit is applied and an output node from which the output signal is output.

13. The semi-dynamic flip-flop of claim 12, further comprising:
   a first inverter gate line extending in the second direction to pass through the first region and the second region, wherein the first inverter gate line receives the latch input signal; and
   a second inverter gate line adjacent to the first inverter gate line in the first direction and extending in the second direction to pass through the first region and the second region,
   wherein the second inverter gate line receives the latch input signal,
   wherein the first inverter gate line and the second inverter gate line form gate electrodes of inverter transistors included in the plurality of inverters.

14. The semi-dynamic flip-flop of claim 13, further comprising:
   a first gate connection via formed in the first region under a lowest metal layer and extending in the first direction to electrically connect the first inverter gate line and the second inverter gate line;
   a second gate connection via formed in the second region under the lowest metal layer and extending in the first direction to electrically connect the first inverter gate line and the second inverter gate line; and
   a plurality of drain connection wirings electrically connecting drain regions of PMOS transistors among the inverter transistors and drain regions of NMOS transistors among the inverter transistors.

15. A semi-dynamic flip-flop, comprising:
   a semiconductor substrate;
   a first power rail, a second power rail, a third power rail, and a fourth power rail disposed on the semiconductor substrate, extending in a first direction, and arranged sequentially in a second direction substantially perpendicular to the first direction; and
   at least one clock gate line disposed on the semiconductor substrate, and extending in the second direction to pass through at least two regions among a first region between the first power rail and the second power rail, a second region between the second power rail and the third power rail, and a third region between the third power rail and the fourth power rail,
   wherein the at least one clock gate line receives an input clock signal,
   wherein the semi-dynamic flip-flop comprises:
   a first circuit configured to generate a first feedback signal based on an input data signal, the input clock signal, a scan enable signal, a scan input signal, and a second feedback signal;
   a second circuit configured to generate the second feedback signal and a latch input signal based on the input data signal, the input clock signal, the scan enable signal, and the first feedback signal; and
   an output circuit configured to generate an output signal corresponding to the input data signal or the scan input signal based on the input clock signal and the latch input signal.

16. The semi-dynamic flip-flop of claim 15, further comprising:
   a scan input gate line extending in the second direction to pass through the second region,
   wherein the scan input gate line forms gate electrodes of scan input transistors in the second region that invert the scan input signal to generate an inverted scan input signal, and the scan input gate line receives the scan input signal;
   an inversion scan input gate line adjacent to the scan input gate line in the first direction and extending in the second direction to pass through the second region and the third region,
   wherein the inversion scan input gate line forms gate electrodes of scan input transistors in the third region that invert the inverted scan input signal to generate a delayed scan input signal; and
   a wiring electrically connecting drain regions of the scan input transistors in the second region and the inversion scan input gate line.

17. The semi-dynamic flip-flop of claim 15, further comprising:
   a scan enable gate line extending in the second direction to pass through the second region and the third region,
   wherein the scan enable gate line receives the scan enable signal.

18. A semi-dynamic flip-flop, comprising:
   a semiconductor substrate;
   a first power rail, a second power rail, a third power rail, and a fourth power rail disposed on the semiconductor substrate, extending in a first direction, and arranged sequentially in a second direction substantially perpendicular to the first direction; and
   a first clock gate line and a second clock gate line disposed on the semiconductor substrate,
   wherein
   each of the first and second clock gate lines receives an input clock signal,
   the first clock gate line extends in the second direction to pass through a first region between the first power rail and the second power rail and a second region between the second power rail and the third power rail,
   the second clock gate line extends in the second direction to pass through the second region and a third region between the third power rail and the fourth power rail, and
   the second clock gate line is adjacent to the first clock gate line in the first direction.

* * * * *